United States Patent
Cho et al.

(10) Patent No.: US 10,840,331 B2
(45) Date of Patent: Nov. 17, 2020

(54) SEMICONDUCTOR DEVICE

(71) Applicant: Samsung Electronics Co., Ltd., Suwon-si (KR)

(72) Inventors: Guyoung Cho, Seoul (KR); Dae-Young Kwak, Seongnam-si (KR); Shinhye Kim, Suwon-si (KR); Koungmin Ryu, Hwaseong-si (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 204 days.

(21) Appl. No.: 15/955,241

(22) Filed: Apr. 17, 2018

(65) Prior Publication Data

US 2019/0058035 A1 Feb. 21, 2019

(30) Foreign Application Priority Data

Aug. 18, 2017 (KR) .................... 10-2017-0104755

(51) Int. Cl.
| | |
|---|---|
| *H01L 29/06* | (2006.01) |
| *H01L 27/088* | (2006.01) |
| *H01L 29/78* | (2006.01) |
| *H01L 21/8234* | (2006.01) |
| *H01L 29/66* | (2006.01) |
| *H01L 21/762* | (2006.01) |

(52) U.S. Cl.
CPC .... *H01L 29/0653* (2013.01); *H01L 21/76224* (2013.01); *H01L 21/823431* (2013.01); *H01L 21/823481* (2013.01); *H01L 21/823487* (2013.01); *H01L 27/088* (2013.01); *H01L 29/66545* (2013.01); *H01L 29/66666* (2013.01); *H01L 29/7827* (2013.01)

(58) Field of Classification Search
CPC ..... H01L 21/823481; H01L 21/823487; H01L 29/66666; H01L 29/0653; H01L 21/823431; H01L 21/76224; H01L 29/66545; H01L 27/088; H01L 29/7827; H01L 27/0886; H01L 29/1033; H01L 29/4236; H01L 29/66613; H01L 29/66795; H01L 29/78; H01L 29/785
See application file for complete search history.

(56) References Cited

U.S. PATENT DOCUMENTS

| | | | |
|---|---|---|---|
| 8,089,797 B2 | 1/2012 | Kim et al. | |
| 8,435,855 B2 * | 5/2013 | Kim .................... | H01L 29/7827 438/258 |
| 8,569,832 B2 * | 10/2013 | Lee ...................... | H01L 29/7827 257/329 |
| 9,184,162 B2 | 11/2015 | Akarvardar et al. | |

(Continued)

FOREIGN PATENT DOCUMENTS

| | | |
|---|---|---|
| KR | 10-0999548 B1 | 12/2010 |
| KR | 10-2011-0029811 A | 3/2011 |

(Continued)

*Primary Examiner* — Bac H Au
(74) *Attorney, Agent, or Firm* — Sughrue Mion, PLLC

(57) ABSTRACT

A semiconductor device includes active patterns protruding from a substrate and an insulation structure surrounding lower portions of the active patterns. The insulation structure includes an insulation layer conforming to a top surface of the substrate and to sidewalls of the active patterns and a buried insulation pattern on the insulation layer.

19 Claims, 46 Drawing Sheets

(56) References Cited

U.S. PATENT DOCUMENTS

| | | | |
|---|---|---|---|
| 9,269,815 B2 | 2/2016 | Cai et al. | |
| 9,412,666 B2 | 8/2016 | Chen et al. | |
| 9,418,994 B1 | 8/2016 | Chao et al. | |
| 9,564,435 B2 | 2/2017 | Chung et al. | |
| 9,824,934 B1* | 11/2017 | Bi | H01L 21/76224 |
| 10,014,372 B1* | 7/2018 | Leobandung | H01L 29/1037 |
| 10,559,502 B2* | 2/2020 | Cheng | H01L 21/823828 |
| 2013/0011987 A1 | 1/2013 | Park | |
| 2016/0380050 A1 | 12/2016 | Kwak et al. | |
| 2017/0062613 A1 | 3/2017 | Sung et al. | |
| 2017/0084625 A1 | 3/2017 | Takeuchi et al. | |
| 2017/0323969 A1* | 11/2017 | Masuoka | H01L 27/11 |
| 2017/0358497 A1* | 12/2017 | Cheng | H01L 21/823481 |
| 2019/0019888 A1* | 1/2019 | Yun | H01L 29/0847 |

FOREIGN PATENT DOCUMENTS

| KR | 10-2015-0022518 A | 3/2015 |
|---|---|---|
| KR | 10-2015-0033878 A | 4/2015 |

* cited by examiner

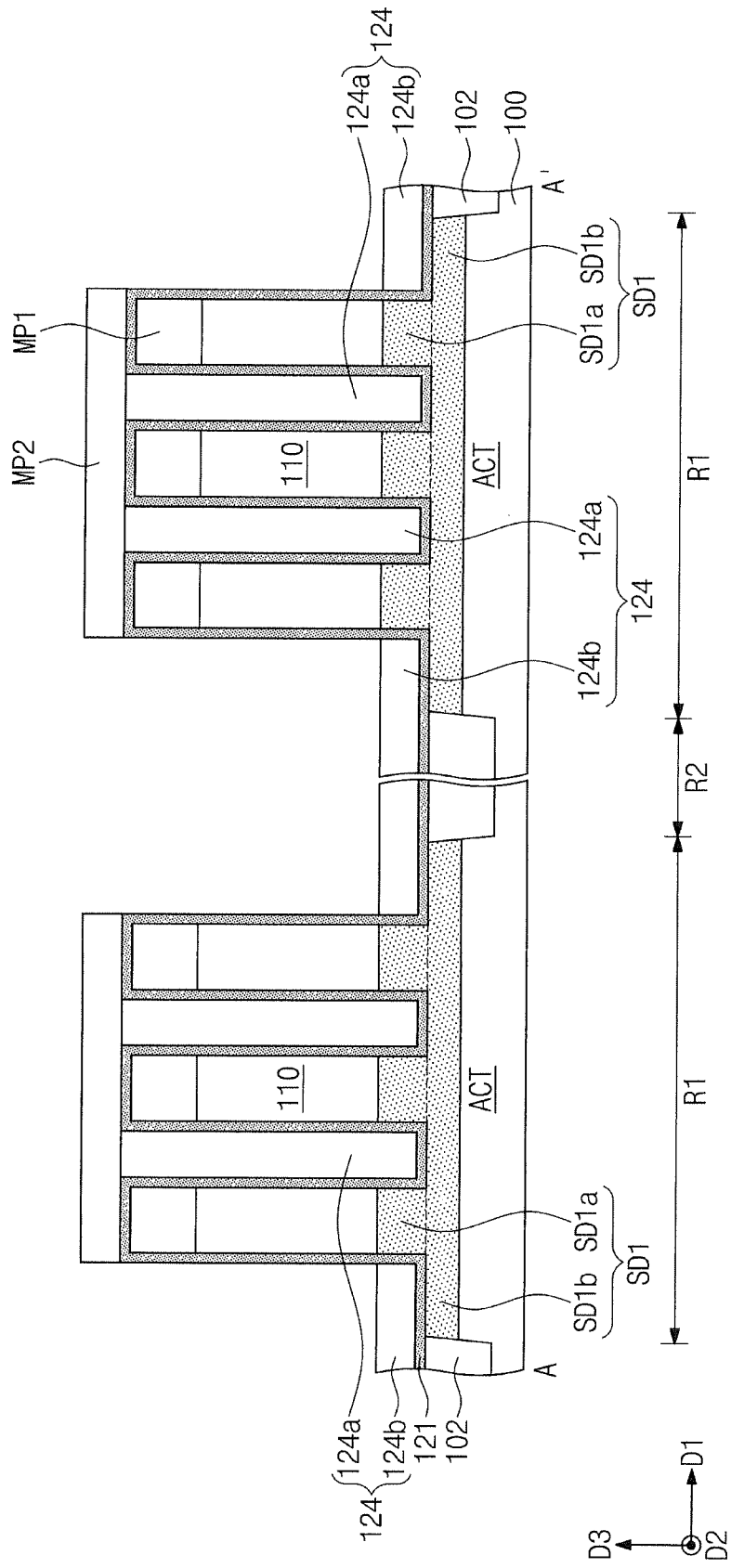

US 10,840,331 B2

SEMICONDUCTOR DEVICE

CROSS-REFERENCE TO RELATED APPLICATION

This U.S. nonprovisional patent application claims priority under 35 U.S.C. § 119 of Korean Patent Application No. 10-2017-0104755, filed Aug. 18, 2017, the entire content of which is hereby incorporated herein by reference in its entirety.

BACKGROUND

The present inventive concepts relate to semiconductor devices, and more particularly, to semiconductor devices including device isolation layers.

A semiconductor device may include an integrated circuit including metal oxide semiconductor field effect transistors (MOSFETs). As sizes and design rules of the semiconductor device have decreased, sizes of the MOSFETs have also decreased. The reduction in size of the MOSFETs may lead to a short channel effect, which may degrade operating characteristics of the semiconductor device. Accordingly, research has been conducted develop techniques for forming a semiconductor device having excellent performance while overcoming limitations due to integration of the semiconductor device.

SUMMARY

Some embodiments of the present inventive concepts can provide semiconductor devices having enhanced reliability.

According to some exemplary embodiments of the present inventive concepts, a semiconductor device includes active patterns protruding from a substrate and an insulation structure surrounding lower portions of the active patterns. The insulation structure includes an insulation layer conforming to a top surface of the substrate and to sidewalls of the active patterns and a buried insulation pattern on the insulation layer.

According to additional exemplary embodiments of the present inventive concepts, a semiconductor device includes a substrate including spaced apart first regions and a second region between the first regions, first active patterns protruding from the substrate on a first one of the first regions, second active patterns protruding from the substrate on a second one of the first regions, and an insulation structure surrounding lower portions of the first and second active patterns. The insulation structure includes an insulation layer conforming to a top surface of the substrate and sidewalls of the first and second active patterns and a buried insulation pattern on the insulation layer.

According to further exemplary embodiments of the present inventive concepts, a semiconductor device includes a pillar shaped active pattern protruding from a substrate and an insulation structure surrounding a lower portion of the active pattern. The insulation structure includes a first insulation layer including a horizontal portion on a top surface of the substrate and a vertical portion extending from the horizontal portion onto sidewalls of the active pattern and a second insulation layer on the first insulation layer.

BRIEF DESCRIPTION OF THE DRAWINGS

FIGS. 4A to 13A and 4B to 13B illustrate cross-sectional views showing a method of fabricating a semiconductor device according to exemplary embodiments of the present inventive concepts.

FIGS. 19A to 24A and 19B to 24B illustrate cross-sectional views showing a method of fabricating a semiconductor device according to exemplary embodiments of the present inventive concepts.

DETAILED DESCRIPTION OF EMBODIMENTS

Figure 1:
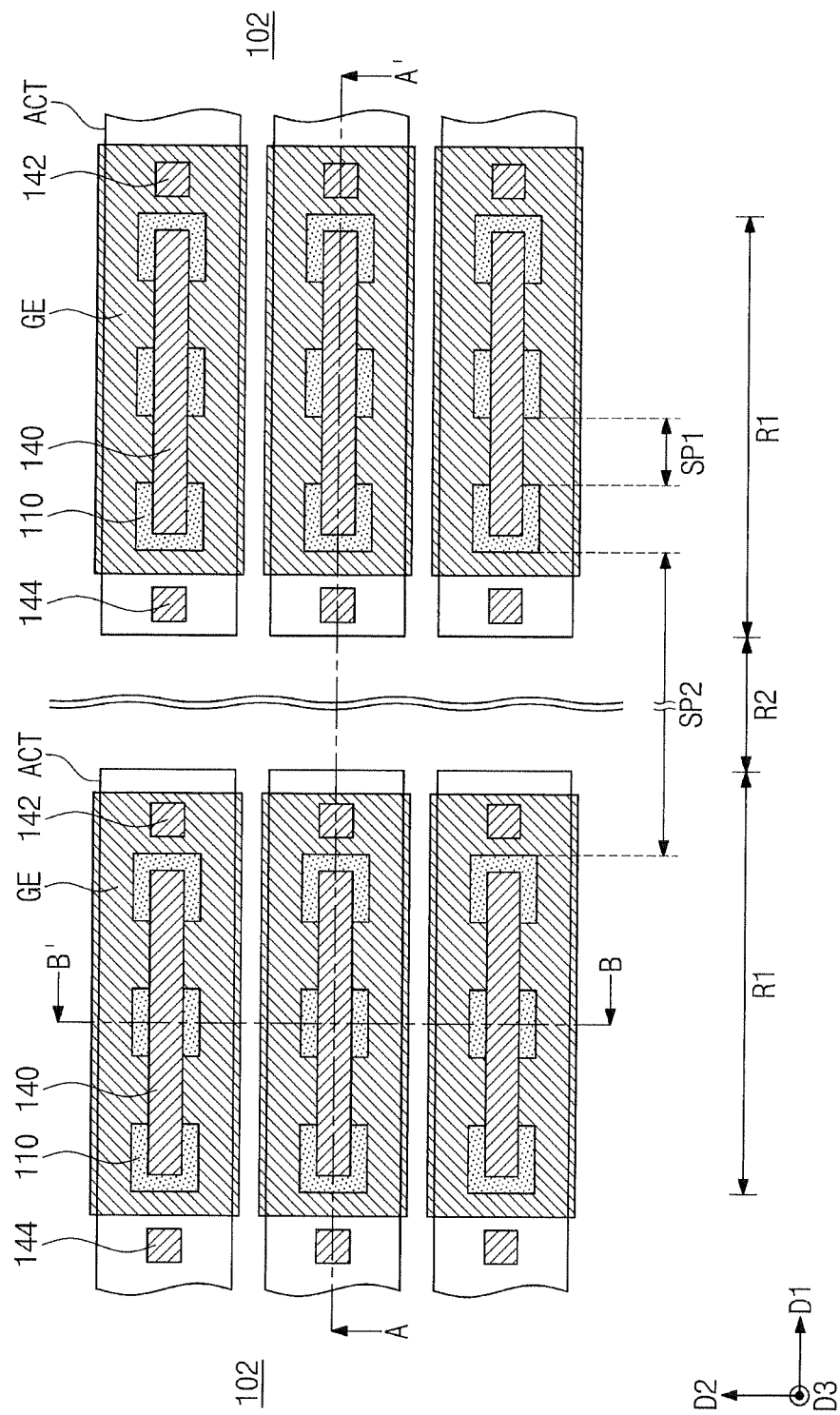
FIG. 1 illustrates a plan view showing a semiconductor device according to exemplary embodiments of the present inventive concepts.

It will be described hereinafter exemplary embodiments of the present inventive concepts with reference to the accompanying drawings. Like reference numerals may indicate like components throughout the description.

Figure 2A:
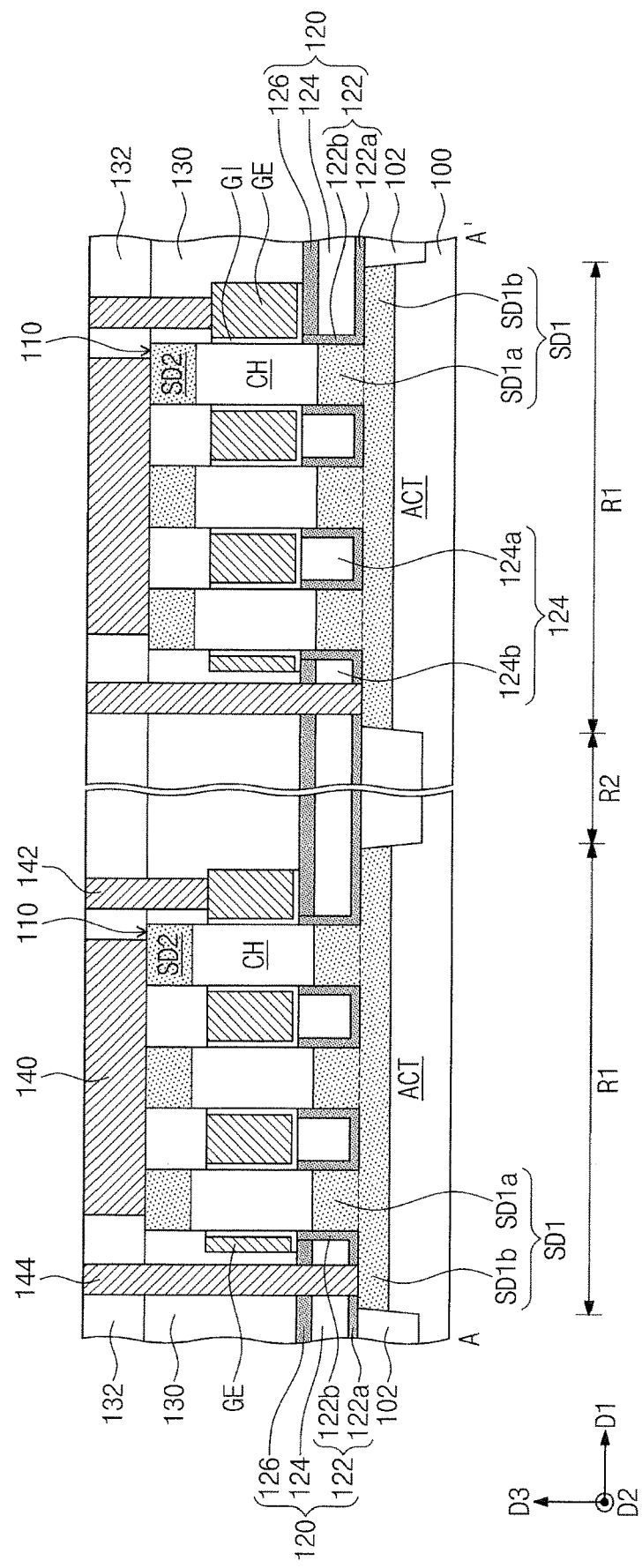
FIGS. 2A and 2B illustrate cross-sectional views showing a semiconductor device according to exemplary embodiments of the present inventive concepts.
Figure 2B:
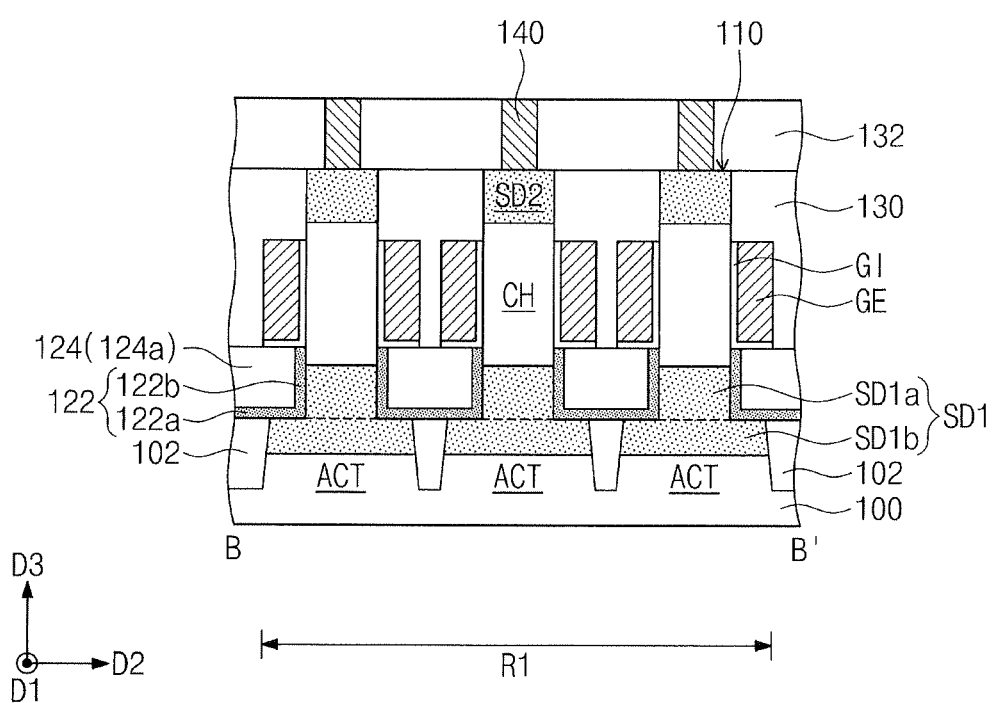

FIG. 1 illustrates a plan view showing a semiconductor device according to exemplary embodiments of the present inventive concepts. FIGS. 2A and 2B illustrate cross-sectional views showing a semiconductor device according to exemplary embodiments of the present inventive concepts. For example, FIG. 2A illustrates a cross-sectional view taken along line A-A' of FIG. 1, and FIG. 2B illustrates a cross-sectional view taken along line B-B' of FIG. 1.

Referring to FIGS. 1, 2A, and 2B, a substrate 100 may be provided. The substrate 100 may be a semiconductor substrate. For example, the substrate 100 may be a compound semiconductor substrate or a semiconductor substrate including silicon or germanium.

The substrate 100 may include first regions R1 spaced apart from each other in a first direction D1 and a second region R2 between the first regions R1. Each of the first and second regions R1 and R2 may extend in a second direction D2 crossing (e.g., perpendicular to) the first direction D1.

The substrate 100 may have a device isolation layer 102 therein that defines active regions ACT. For example, when viewed in plan, the substrate 100 may have the active region ACT at its portion surrounded by the device isolation layer 102. The device isolation layer 102 may be provided to have a predetermined depth from a top surface of the substrate 100. The device isolation layer 102 may include, for example, silicon oxide, silicon nitride, and/or silicon oxynitride.

The active regions ACT may be defined in the first regions R1. The active regions ACT may be spaced apart from each other in the second direction D2 in each of the first regions R1. For example, the active regions ACT may be equally spaced along the second direction D2 in each of the first regions R1. For example, when viewed in plan, each of the active regions ACT may extend in the first direction D1.

The first regions R1 may be provided with active patterns 110. The active patterns 110 may be provided on the active regions ACT. A plurality of the active patterns 110 may be provided on one active region ACT. For example, as illustrated in FIGS. 1 and 2A, three active patterns 110 may be provided on one active region ACT. The present inventive concepts, however, are not limited thereto. For example, unlike that illustrated in FIGS. 1 and 2A, one active region ACT may be provided thereon with two active patterns 110 or with four or more active patterns 110. The active patterns 110 may be disposed in the first direction D1 on one active region ACT. The present inventive concepts, however, are not limited thereto. A spacing SP1 between the active patterns 110 provided on a given first region R1 may be less than a spacing SP2 between the active patterns 110 provided on adjacent first regions R1.

Each of the active patterns 110 may have a pillar shape that protrudes from the top surface of the substrate 100 or from a top surface of the active region ACT. For example, each of the active patterns 110 may extend in a third direction D3 perpendicular to the top surface of the substrate 100. Each of the active patterns 110 may include at least a portion (e.g., an upper portion SD1a) of a first source/drain SD1 provided on the each of the active patterns 110, a second source/drain SD2 at an upper portion of the each of the active patterns 110, and a channel CH between the first and second source/drains SD1 and SD2. The first and second source/drains SD1 and SD2 may include the same impurity-doped semiconductor material. For example, the first and second source/drains SD1 and SD2 may include silicon doped with one of n-type and p-type impurities. The channel CH may include a semiconductor material. For example, the channel CH may include undoped silicon.

The first source/drain SD1 may include an upper portion SD1a and a lower portion SD1b. The upper portion SD1a of the first source/drain SD1 may be provided in the active pattern 110, and the lower portion SD1b of the first source/drain SD1 may be provided in the active region ACT connected to the active pattern 110. The lower portions SD1b of the first source/drains SD1 provided on one active region ACT may be connected to each other.

A lower insulation structure 120 may be provided on the substrate 100. The lower insulation structure 120 may cover the top surface of the substrate 100, a top surface of the device isolation layer 102, and lower sidewalls of the active patterns 110. A portion of each active pattern 110 may protrude from a top surface of the lower insulation structure 120. For example, the channel CH of each active pattern 110 may protrude from the top surface of the lower insulation structure 120.

The lower insulation structure 120 may include a first line pattern 122, a buried pattern 124, and a second line pattern 126. The first and second line patterns 122 and 126 may be insulation layers that have an etch selectivity to the buried pattern 124. For example, the first and second line patterns 122 and 126 may include insulation layers comprising silicon nitride, silicon oxynitride, silicon carbon nitride, silicon carbide, and/or silicon oxycarbide, and the buried pattern 124 may include silicon oxide.

The first line pattern 122 may be an insulation layer that conformally covers the top surface of the substrate 100, the top surface of the device isolation layer 102, and extends onto the lower sidewalls of the active patterns 110. In such a configuration, the first line pattern 122 may include a horizontal segment 122a that covers the top surfaces of the substrate 100 and the device isolation layer 102 and vertical segments 122b that cover the lower sidewalls of the active patterns 110. For example, the horizontal segment 122a of the first line pattern 122 may be in contact with the top surfaces of the substrate 100 and the device isolation layer 102, and the vertical segments 122b of the first line pattern 122 may be in contact with the lower sidewalls of the active patterns 110. The vertical segments 122b may protrude from the horizontal segment 122a and may extend in the third direction D3. The vertical segments 122b may have top surfaces at substantially the same level. In this description, the term "level" may mean a height from the top surface of the substrate 100.

The buried pattern 124 may occupy a volume defined by the first line pattern 122. For example, the buried pattern 124 may be provided on a top surface of the horizontal segment 122a of the first line pattern 122 and on sidewalls of the vertical segments 122b of the first line pattern 122.

The buried pattern 124 may include a first buried segment 124a and a second buried segment 124b. When viewed in plan, the first buried segment 124a may be provided between the active patterns 110 provided on the same first region R1, and the second buried segment 124b may be provided outside the active patterns 110 provided on the same first region R1. For example, the second buried segment 124b may be provided between the active patterns 110 provided on different first regions R1. The first buried segment 124a may have a top surface at substantially the same level as those of the top surfaces of the vertical segments 122b.

In some embodiments, as illustrated in FIG. 2A, the top surface of the first buried segment 124a may be located at a level different from that of a top surface of the second buried segment 124b. For example, the top surface level of the first buried segment 124a may be higher than that of the second buried segment 124b. The present inventive concepts, however, are not limited thereto.

The second line pattern 126 may be provided on the buried pattern 124. When viewed in plan, the second line pattern 126 may be provided outside, but not between, the active patterns 110 provided on the same first region R1. For example, the second line pattern 126 may be provided on the top surface of the second buried segment 124b, but not on the top surface of the first buried segment 124a. The second line pattern 126 may be connected to some but not all of the vertical segments 122b. The second line pattern 126 may have a top surface whose level is substantially the same as that of the top surface of the first buried segment 124a.

Gate electrodes GE may be provided on the lower insulation structure 120. When viewed in plan, the gate electrodes GE may be provided to correspond to the active regions ACT. When viewed in plan, each of the gate electrodes GE may surround sidewalls of the active patterns 110 provided on one active region ACT. For example, each of the gate electrodes GE may surround the channels CH of the active patterns 110 provided on one active region ACT. The gate electrodes GE may have top surfaces whose levels are lower than those of top surfaces of the active patterns 110. The gate electrodes GE may include, for example, one or more of conductive metal nitride (e.g., titanium nitride or tantalum nitride) and metal (e.g., titanium, tantalum, tungsten, copper, or aluminum).

Gate dielectric patterns GI may be provided between the gate electrodes GE and the active patterns 110. Each of the gate dielectric patterns GI may extend between the gate electrode GE and the lower insulation structure 120. The gate dielectric patterns GI may have top surfaces whose levels are substantially the same as those of the top surfaces of the gate electrodes GE. The gate dielectric patterns GI may include silicon oxide, silicon oxynitride, and/or high-k dielectric. For example, the high-k dielectric may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The top surface of the gate electrode GE may have an even level. The gate electrode GE may have a bottom surface whose certain portion is disposed on the first buried segment 124a of the buried pattern 124 and whose other portion is provided on the second line pattern 126. As discussed above, since the top surface level of the first buried segment 124a is substantially the same as that of the second line pattern 126, the bottom surface of the gate electrode GE may also have an even level. The gate electrode GE may therefore have a uniform vertical length.

A portion of each active pattern 110 may protrude beyond the top surfaces of the gate electrodes GE. For example, the second source/drain SD2 of each active pattern 110 may protrude beyond the top surfaces of the gate electrodes GE.

The active patterns 110 and the gate electrodes GE may constitute vertical transistors. For example, one vertical transistor may be formed by the gate electrode GE and the active patterns 110 provided on one active region ACT. As discussed above, as the gate electrode GE has the uniform vertical length, the vertical transistor according to exemplary embodiments of the present inventive concepts may have a reduced distribution in electrical characteristics.

A first interlayer dielectric layer 130 may be provided on the lower insulation structure 120. The first interlayer dielectric layer 130 may cover the gate electrodes GE and upper sidewalls of the active patterns 110 protruding from the top surfaces of the gate electrodes GE. The first interlayer dielectric layer 130 may have a top surface whose level is substantially the same as those of the top surfaces of the active patterns 110. For example, the first interlayer dielectric layer 130 may include silicon oxide, silicon nitride, and/or silicon oxynitride.

A second interlayer dielectric layer 132 may be provided on the first interlayer dielectric layer 130. The second interlayer dielectric layer 132 may cover the top surface of the first interlayer dielectric layer 130 and the top surfaces of the active patterns 110. For example, the second interlayer dielectric layer 132 may include silicon oxide, silicon nitride, and/or silicon oxynitride.

First upper contacts 140 may be provided in the second interlayer dielectric layer 132. Each of the first upper contacts 140 may penetrate the second interlayer dielectric layer 132 to come into connection with the second source/drains SD2. For example, each of the first upper contacts 140 may be coupled in common to the second source/drains SD of the active patterns 110 provided on one active region ACT.

Second upper contacts 142 may be provided in the first and second interlayer dielectric layers 130 and 132. The second upper contacts 142 may penetrate the first and second interlayer dielectric layers 130 and 132 to come into connection with corresponding gate electrodes GE.

Third upper contacts 144 may be provided in the lower insulation structure 120 and the first and second interlayer dielectric layers 130 and 132. The third upper contacts 144 may penetrate the lower insulation structure 120 and the first and second interlayer dielectric layers 130 and 132 to come into connection with corresponding first source/drains SD1. For example, the third upper contacts 144 may penetrate the lower insulation structure 120 and the first and second interlayer dielectric layers 130 and 132 to come into connection with corresponding lower portions SD1b of the first source/drains SD1.

The first to third upper contacts 140, 142, and 144 may include one or more of conductive metal nitride (e.g., titanium nitride or tantalum nitride) and metal (e.g., titanium, tantalum, tungsten, copper, or aluminum).

Figure 3A:
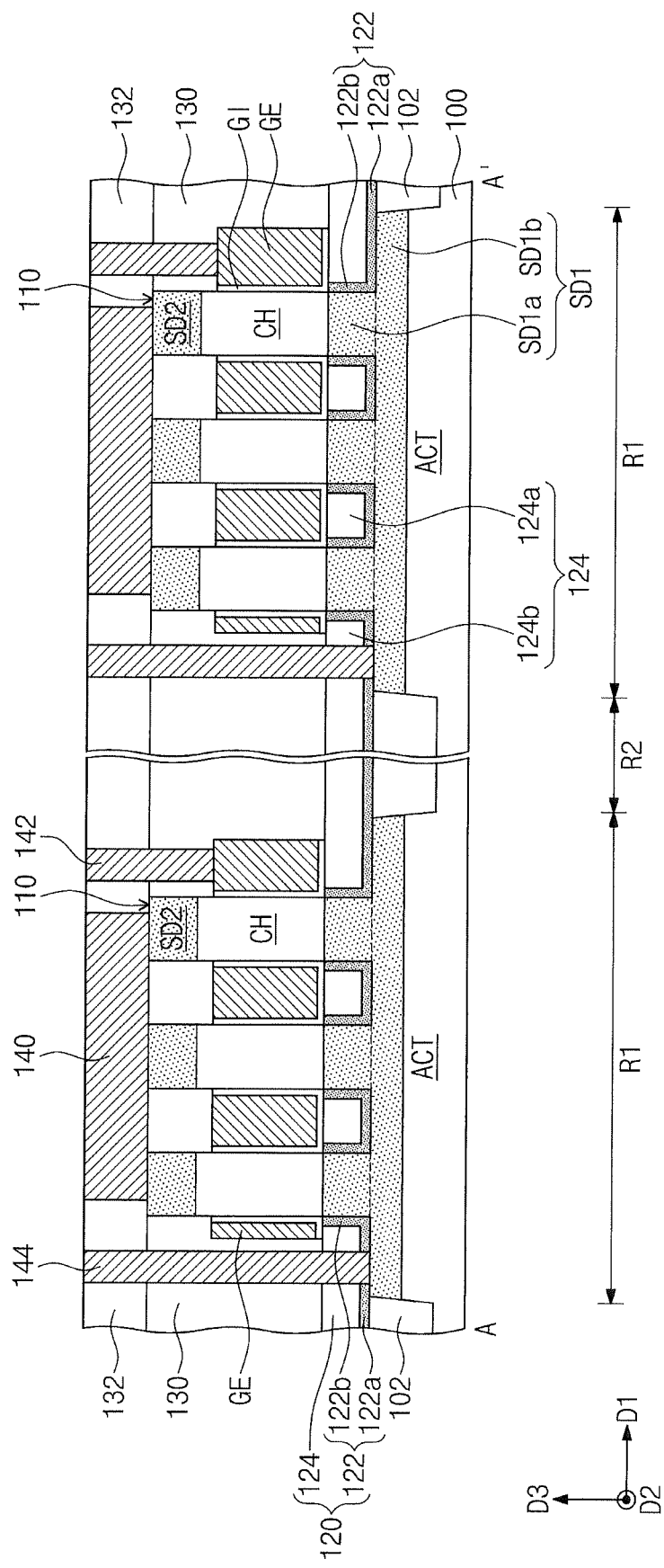
FIGS. 3A and 3B illustrate cross-sectional views showing a semiconductor device according to exemplary embodiments of the present inventive concepts.
Figure 3B:
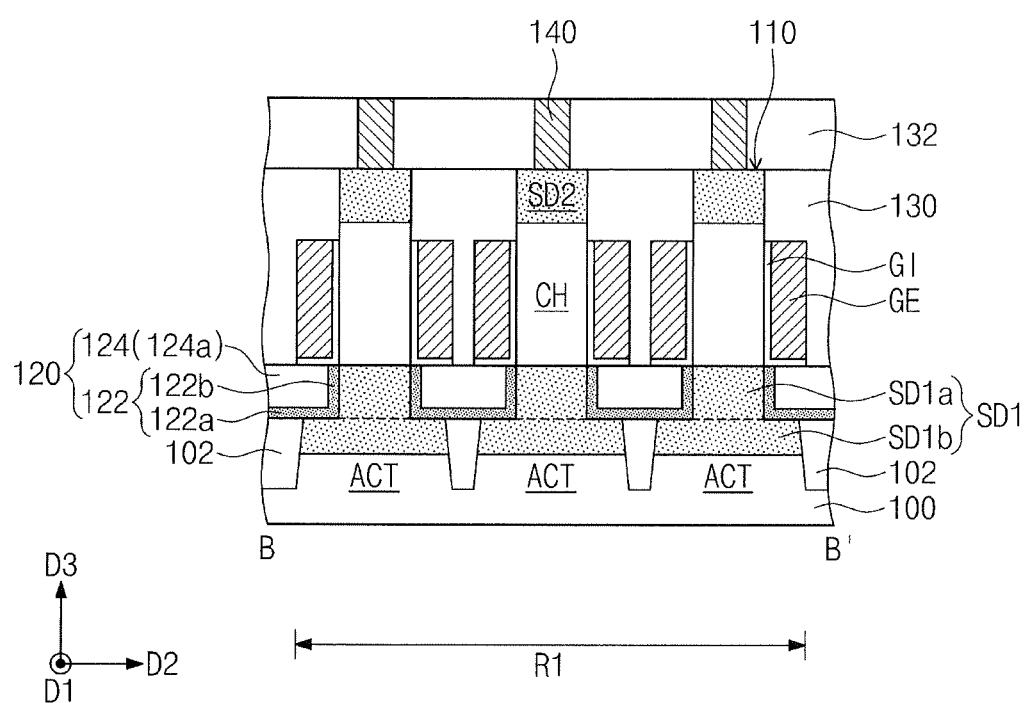

FIGS. 3A and 3B illustrate cross-sectional views showing a semiconductor device according to exemplary embodiments of the present inventive concepts. For example, FIG. 3A illustrates a cross-sectional view taken along line A-A' of FIG. 1, and FIG. 3B illustrates a cross-sectional view taken along line B-B' of FIG. 1. In the embodiments that follow, components substantially the same as those discussed with reference to FIGS. 1, 2A, and 2B may be allocated the same reference numerals thereto, and a repetitive description thereof may be omitted. The lower insulation structure 120 and its related components will be discussed hereinafter in detail.

Referring to FIGS. 1, 3A, and 3B, the lower insulation structure 120 may be provided on the substrate 100. The lower insulation structure 120 may cover the top surface of the substrate 100, the top surface of the device isolation layer 102, and the lower sidewalls of the active patterns 110. A portion of each active pattern 110 may protrude from the top surface of the lower insulation structure 120. For example, the channel CH of each active pattern 110 may protrude from the top surface of the lower insulation structure 120.

The lower insulation structure 120 may include the first line pattern 122 and the buried pattern 124. Unlike that discussed with reference to FIGS. 1, 2A, and 2B, the lower insulation structure 120 may include no second line pattern 126.

The first line pattern 122 may be configured substantially the same as that discussed with reference to FIGS. 1, 2A, and 2B.

The buried pattern 124 may be provided on the first line pattern 122. For example, the buried pattern 124 may be provided on the top surface of the horizontal segment 122a of the first line pattern 122 and on the sidewalls of the vertical segments 122b of the first line pattern 122.

The buried pattern 124 may include the first buried segment 124a and the second buried segment 124b. When viewed in plan, the first buried segment 124a may be provided between the active patterns 110 provided on the same first region R1, and the second buried segment 124b may be provided outside the active patterns 110 provided on the same first region R1. For example, the second buried segment 124b may be provided between the active patterns 110 provided on different first regions R1.

As illustrated in FIG. 3A, the top surfaces of the first and second buried segments 124a and 124b may be located at substantially the same level. For example, the top surface levels of the first and second buried segments 124a and 124b may be substantially the same as those of the vertical segments 122b.

The gate electrodes GE may be provided on the lower insulation structure 120. The gate electrodes GE may be configured substantially the same as those discussed with reference to FIGS. 1, 2A, and 2B.

The top surface of the gate electrode GE may have an even level. The gate electrode GE may have the bottom surface whose certain portion is disposed on the first buried segment 124a of the buried pattern 124 and whose other portion is provided on the second buried segment 124b of the buried pattern 124. As discussed above, since the top surface level of the first buried segment 124a is substantially the same as that of the second buried segment 124b, the bottom surface of the gate electrode GE may also have an even level. The gate electrode GE may therefore have a uniform vertical length.

FIGS. 4A to 13A and 4B to 13B illustrate cross-sectional views showing a method of fabricating a semiconductor device according to exemplary embodiments of the present inventive concepts. For example, FIGS. 4A to 13A illustrate cross-sectional views taken along line A-A' of FIG. 1, and FIGS. 4B to 13B illustrates cross-sectional views taken along line B-B' of FIG. 1. In the embodiments that follow, components substantially the same as those discussed with reference to FIGS. 1, 2A, and 2B may be allocated the same reference numerals thereto, and a repetitive description thereof may be omitted.

Figure 4A:
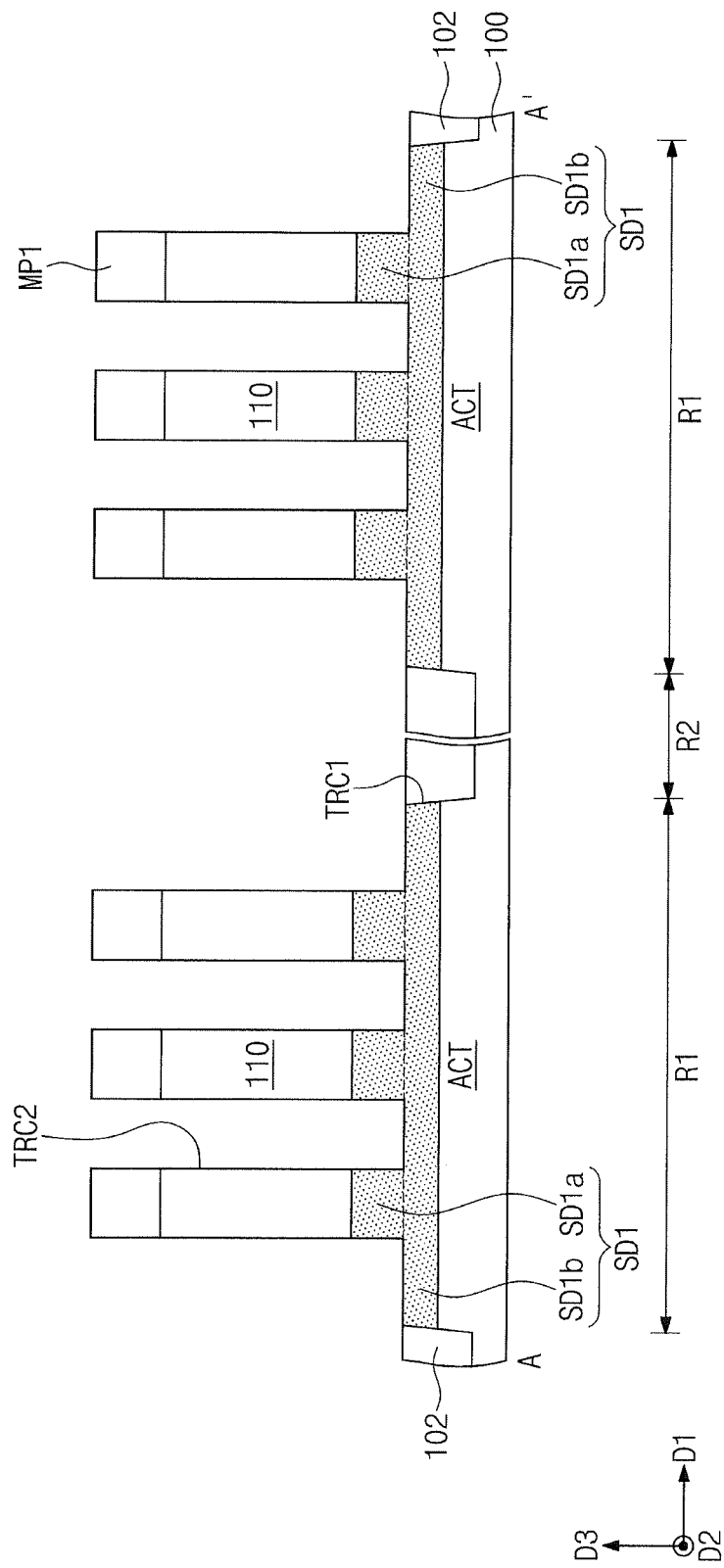
Figure 4B:
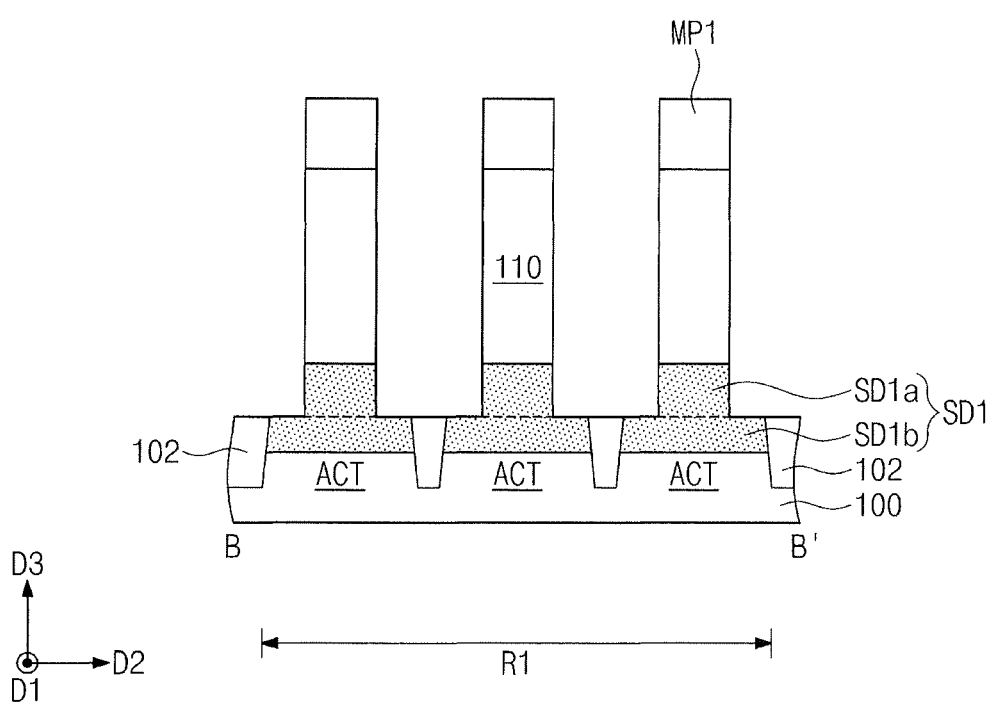

Referring to FIGS. 1, 4A, and 4B, a substrate 100 may be provided to include first regions R1 spaced apart from each other in a first direction D1 and a second region R2 between the first regions R1. Each of the first and second regions R1 and R2 may extend in a second direction D2 crossing (e.g., perpendicular to) the first direction D1.

A device isolation layer 102 may be formed in the substrate 100 to thereby define active regions ACT. The active regions ACT may be defined in the first regions R1. The active regions ACT may be spaced apart from each other in the second direction D2 in each of the first regions R1. For example, when viewed in plan, each of the active regions ACT may extend in the first direction D1. The formation of the device isolation layer 102 may include forming a first trench TRC1 to define the active regions ACT and forming the device isolation layer 102 in the first trench TRC1.

Active patterns 110 may be formed on the first regions R1. The active patterns 110 may be formed on the active regions ACT. For example, as illustrated in FIGS. 1 and 2A, three active patterns 110 may be formed on one active region ACT. The present inventive concepts, however, are not limited thereto.

The formation of the active patterns 110 may include forming first mask patterns MP1 on the substrate 100 and performing an etching process to etch the substrate 100 using the first mask patterns MP1 as an etch mask. In some embodiments, the etching process may also etch the device isolation layer 102. The etching process may form a second trench TRC2 defining the active patterns 110. The second trench TRC2 may have a floor surface whose level is higher than that of a floor surface of the first trench TRC1.

First source/drains SD1 may be formed at lower portions of the active patterns 110. The first source/drains SD1 may be formed by implanting impurities into the lower portions of the active patterns 110. For example, an ion implantation process may be employed to form the first source/drains SD1. Each of the first source/drains SD1 may include an upper portion SD1a formed in the active pattern 110 and a lower portion SD1b formed in the active region ACT. The lower portions SD1b of the first source/drains SD1 provided on one active region ACT may be connected to each other.

Figure 5A:
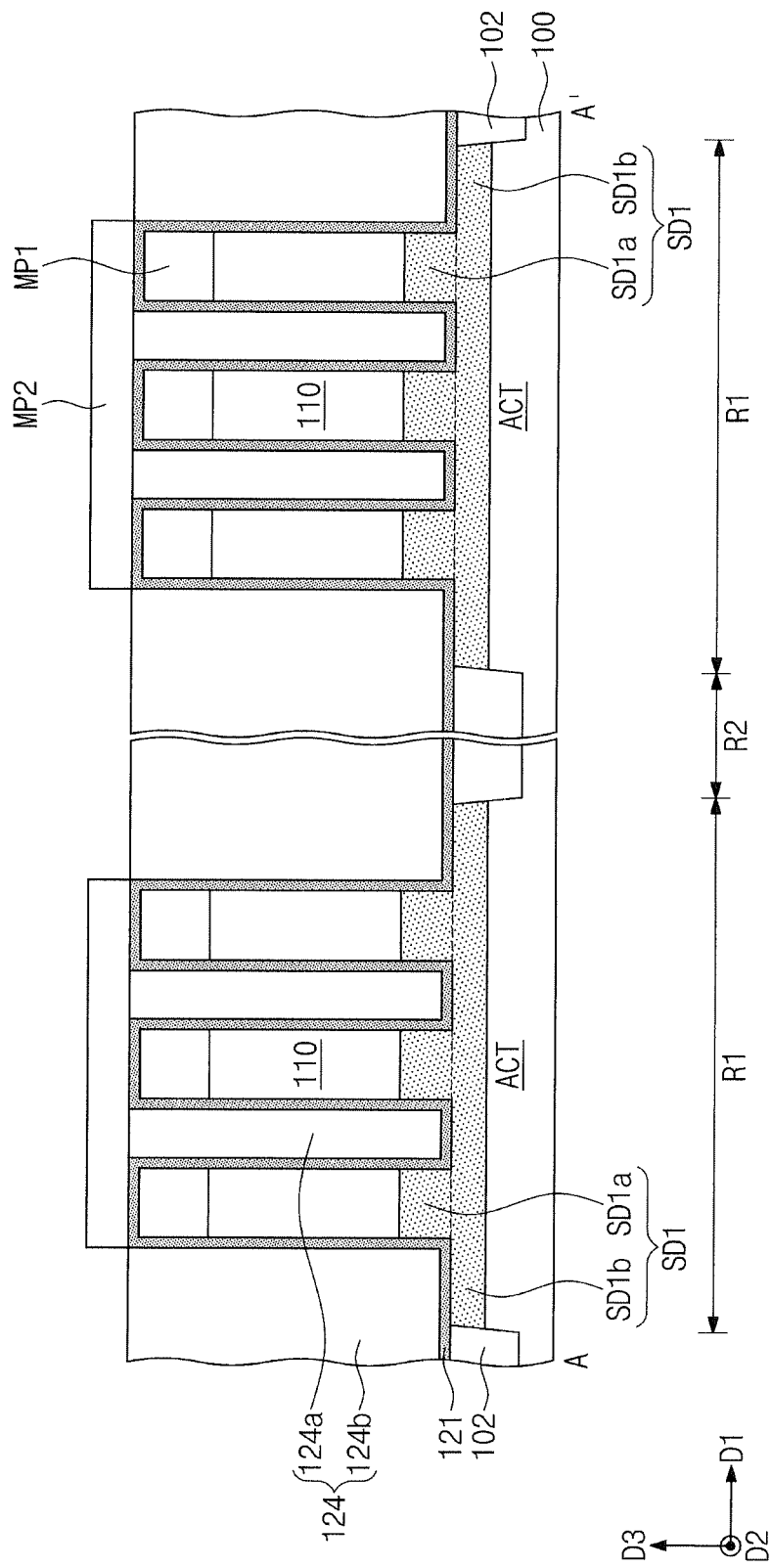
Figure 5B:
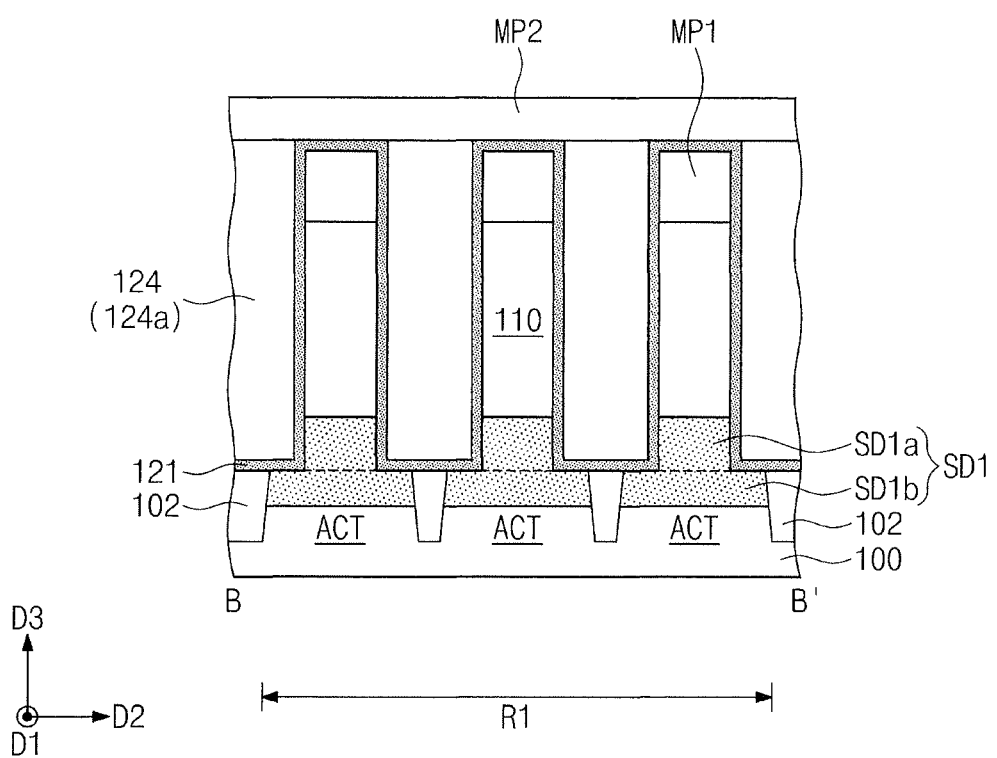

Referring to FIGS. 1, 5A, and 5B, a first line layer 121 may be formed to conformally cover a top surface of the substrate 100, a top surface of the device isolation layer 102, and sidewalls of the active patterns 110. For example, the first line layer 121 may be formed using a chemical vapor deposition (CVD) process or an atomic layer deposition (ALD) process. The first line layer 121 may include, for example, silicon nitride, silicon oxynitride, silicon carbon nitride, silicon carbide, and/or silicon oxycarbide.

A buried pattern 124 may be formed on the first line layer 121. The formation of the buried pattern 124 may include forming a buried layer (not shown) to cover the first line layer 121 and performing a first planarization process on the buried layer until a top surface of the first line layer 121 is exposed. For example, the buried layer may be formed using a flowable chemical vapor deposition (FCVD) process or tonen silazene (TOSZ). The first planarization process may be performed using, for example, a chemical mechanical polishing process. For example, the buried pattern 124 may include silicon oxide.

The buried pattern 124 may include a first buried segment 124a and a second buried segment 124b. When viewed in plan, the first buried segment 124a may be formed between the active patterns 110 provided on the same first region R1, and the second buried segment 124b may be formed outside the active patterns 110 provided on the same first region R1. For example, the second buried segment 124b may be formed between the active patterns 110 provided on different first regions R1.

Second mask patterns MP2 may be formed on the buried pattern 124. The second mask patterns MP2 may be formed on corresponding first regions R1. Each of the second mask patterns MP2 may extend in the second direction D2. Each of the second mask patterns MP2 may cover the first buried segment 124a on the first region R1 corresponding to the each of the second mask patterns MP2. For example, each of the second mask patterns MP2 may cover the active patterns 110 on the first region R1 corresponding to the each of the second mask patterns MP2. The second buried segment 124b may be exposed between the second mask patterns MP2.

Figure 6B:
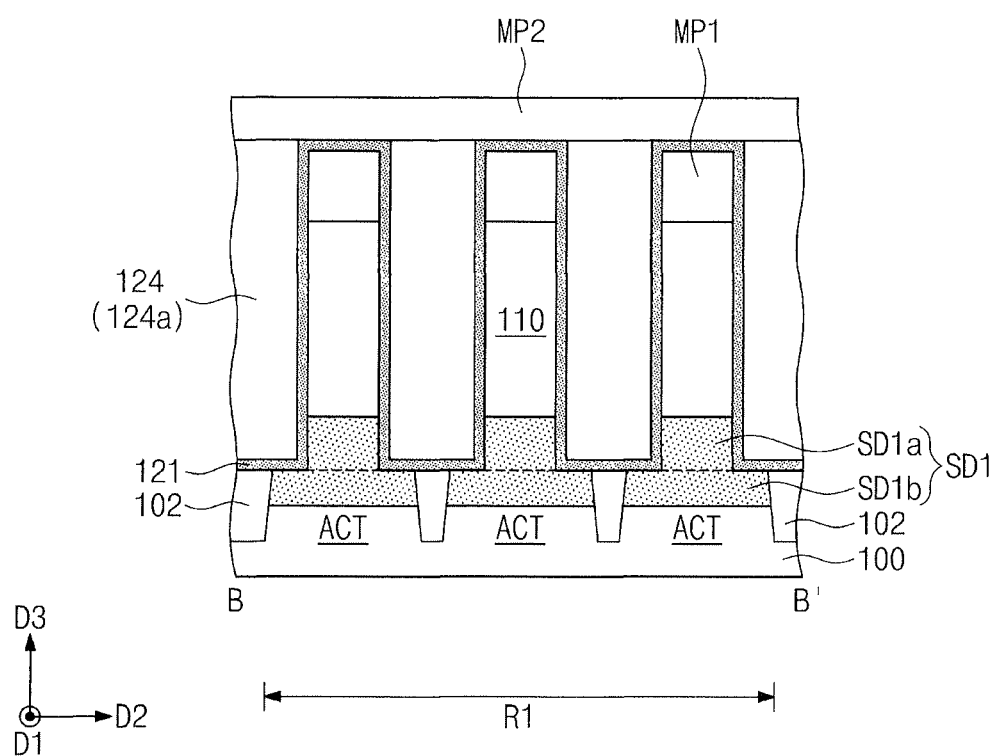

Referring to FIGS. 1, 6A, and 6B, the second buried segment 124b may be partially etched. The second buried segment 124b may thus have a top surface whose level is reduced. The partial etching of the second buried segment 124b may be performed by an etching process in which the second mask patterns MP2 are used as an etch mask. The etching process may have an etch selectivity to the first line layer 121. The first buried segment 124a may not be etched during the etching process.

Figure 7A:
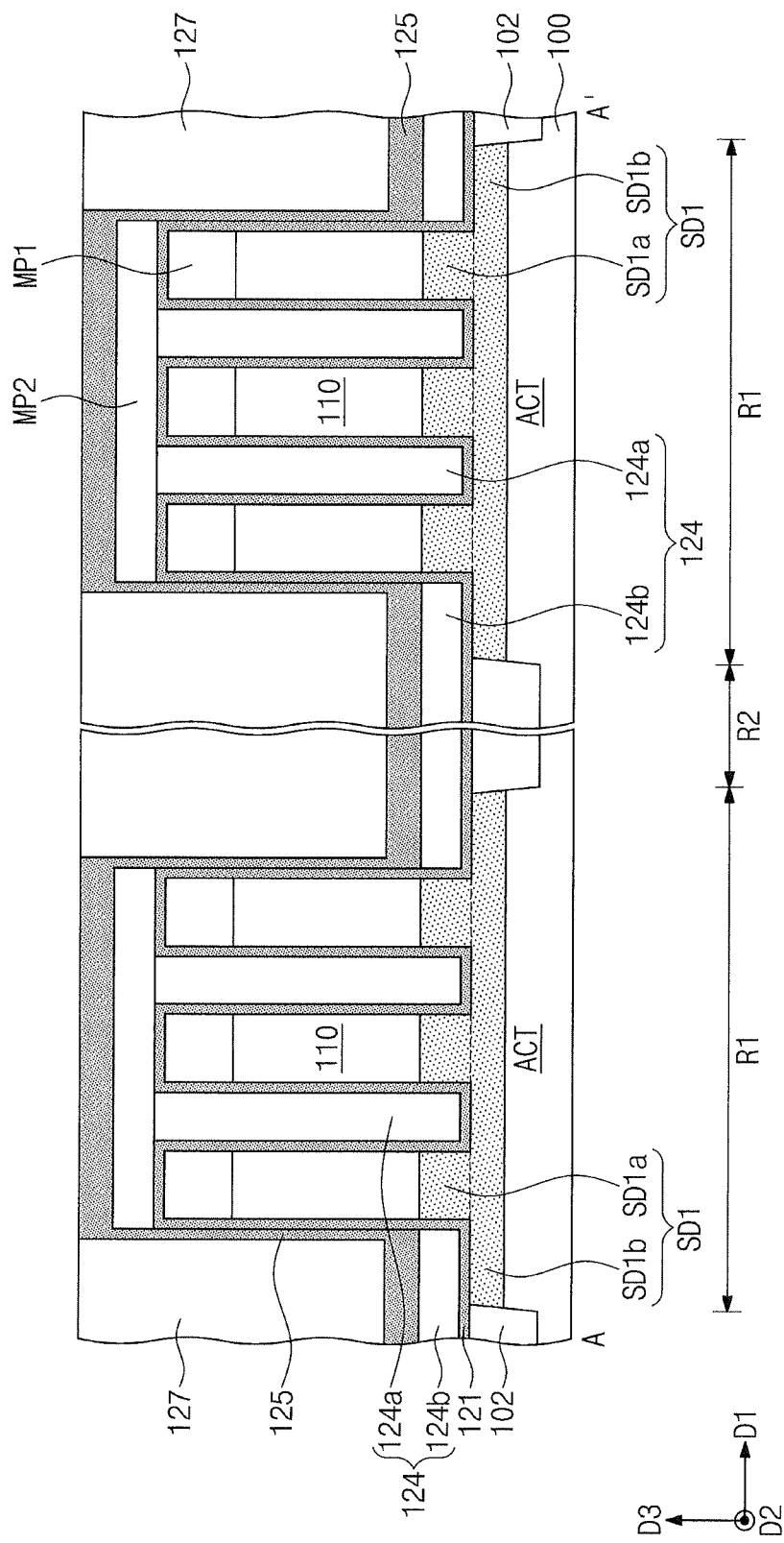
Figure 7B:
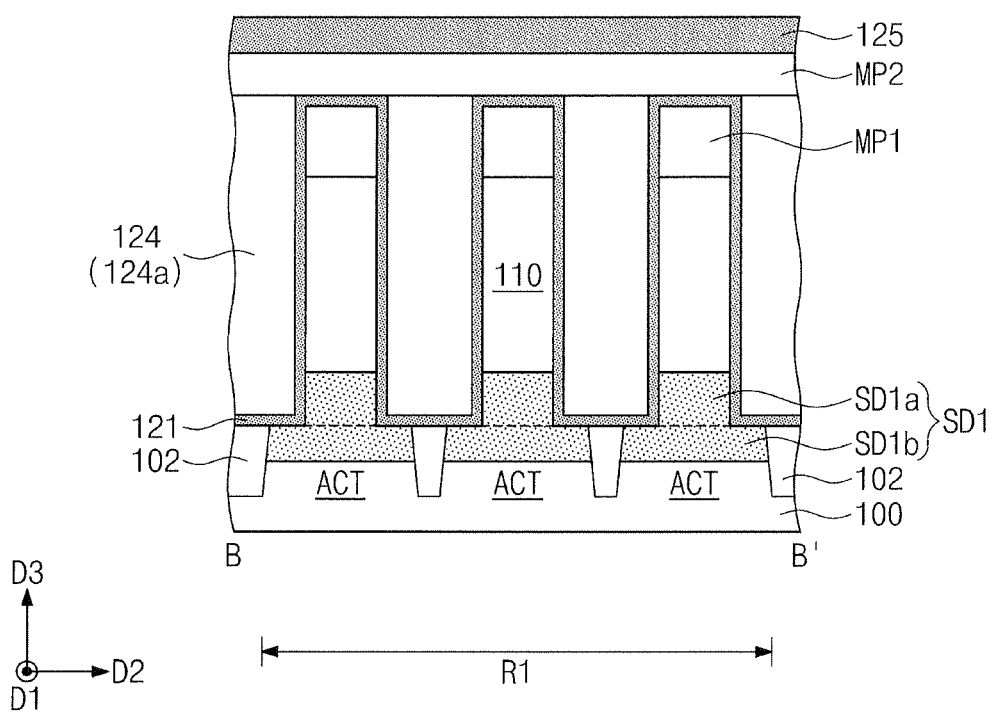

Referring to FIGS. 1, 7A, and 7B, a second line layer 125 may be formed. The second line layer 125 may cover the top surface of the second buried segment 124b, top surfaces of the second mask patterns MP2, and the first line layer 121 exposed beneath the second mask patterns MP2. For example, the second line layer 125 may be formed using a CVD process or an ALD process. The second line layer 125 may include, for example, silicon nitride, silicon oxynitride, silicon carbon nitride, silicon carbide, and/or silicon oxycarbide.

In some embodiments, as illustrated in FIG. 7A, the second line layer 125 may be formed by a deposition process having a poor step coverage. Accordingly, the second line layer 125 may have a thickness that is greater on the top surface of the second buried segment 124b and the top surfaces of the second mask patterns MP2 than on the sidewalls of the active patterns 110 and sidewalls of the first buried segment 124a. The present inventive concepts, however, are not limited thereto.

A sacrificial pattern 127 may be formed on the second line layer 125. The formation of the sacrificial pattern 127 may include forming a sacrificial layer (not shown) to cover the second line layer 125 and performing a second planarization process on the sacrificial layer until a top surface of the second line layer 125 is exposed. For example, the sacrificial layer may be formed using an FCVD process or TOSZ. The sacrificial pattern 127 may include, for example, silicon oxide.

Figure 8A:
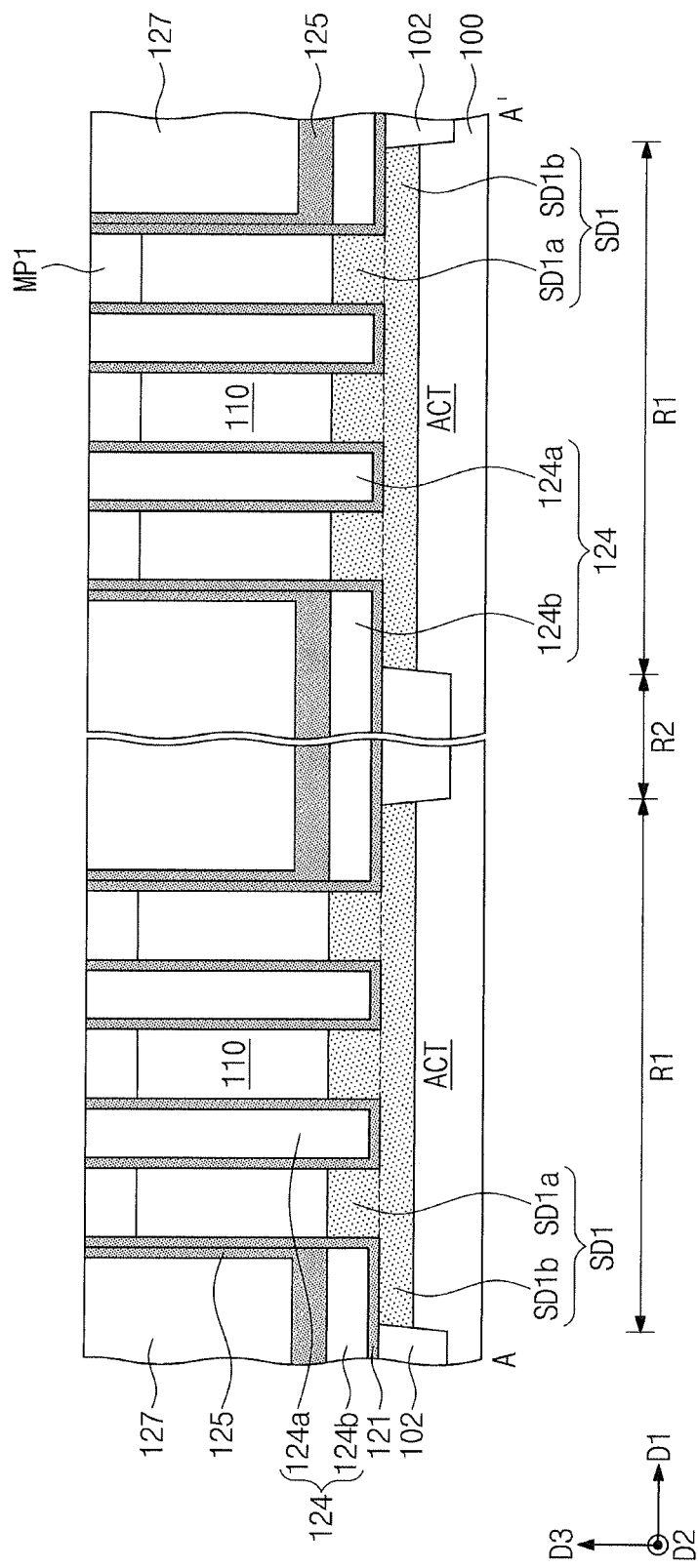
Figure 8B:
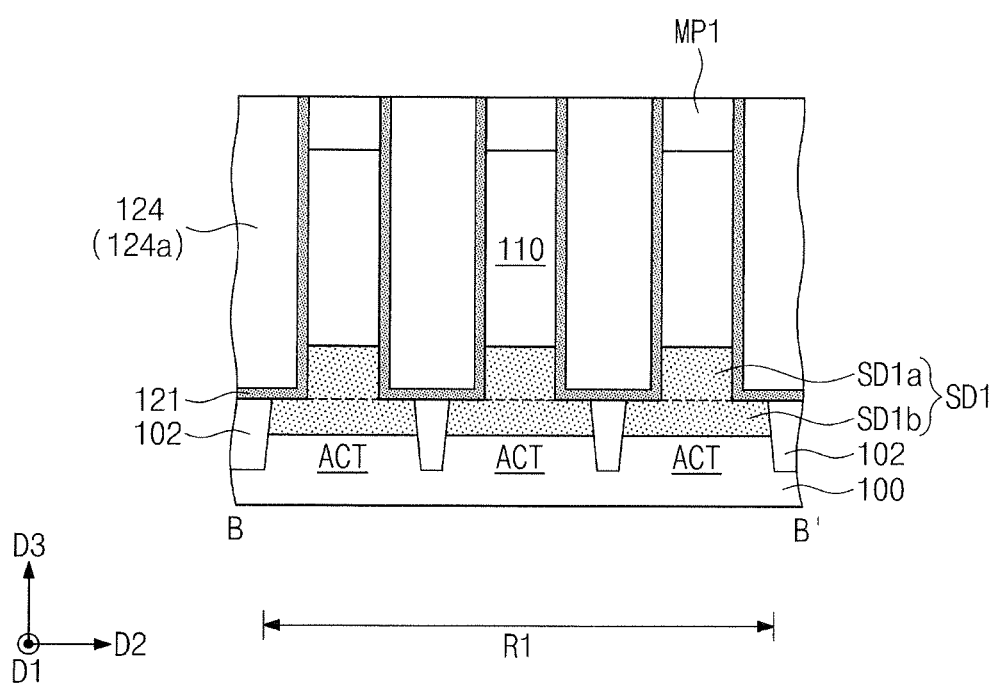

Referring to FIGS. 1, 8A, and 8B, a third planarization process may be performed until top surfaces of the first mask patterns MP1 are exposed. The third planarization process may remove portions of the second line layer 125 that are formed on the second mask patterns MP2, the second mask patterns MP2, and portions of the first line layer 121 that are formed on the first mask patterns MP1. In addition, the third planarization process may expose the first buried segment 124a between the first mask patterns MP1. For example, the third planarization process may be performed using a chemical mechanical polishing process.

Figure 9A:
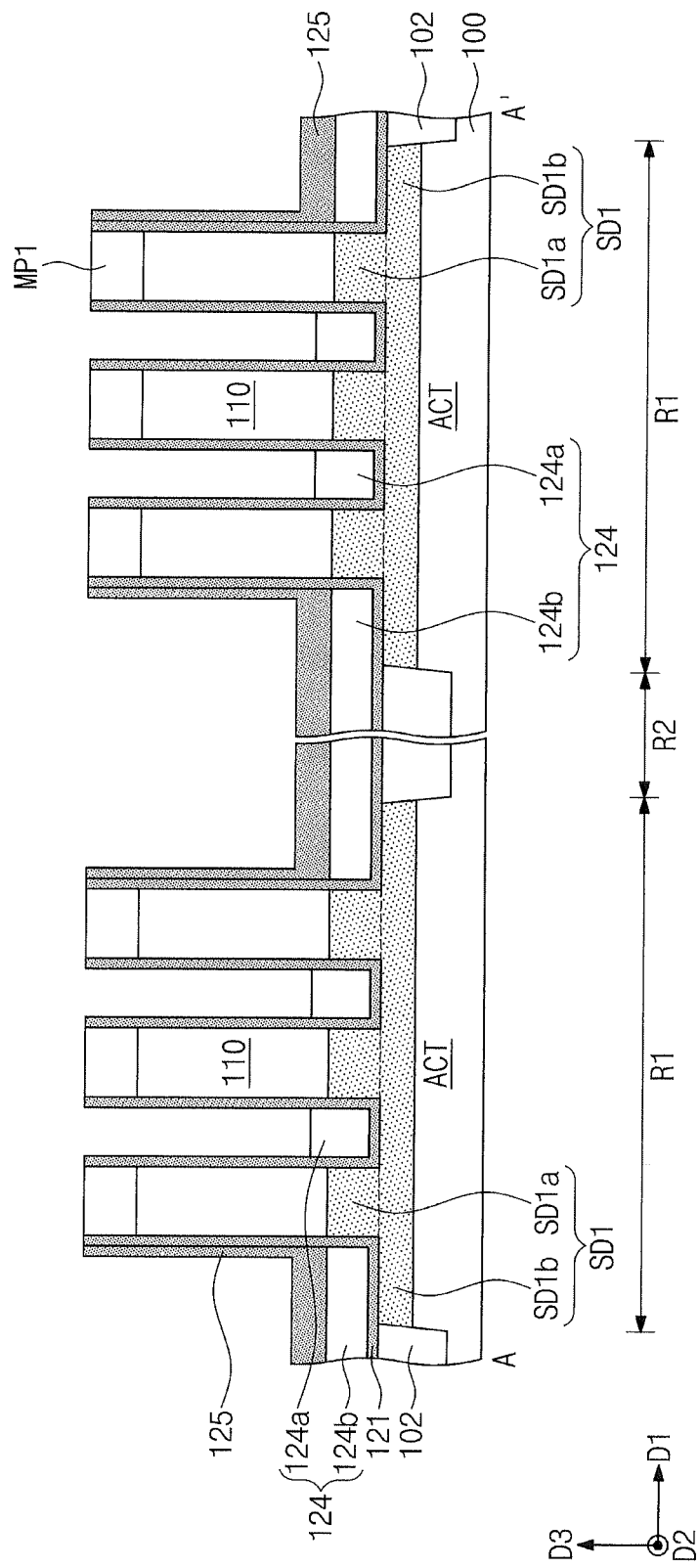
Figure 9B:
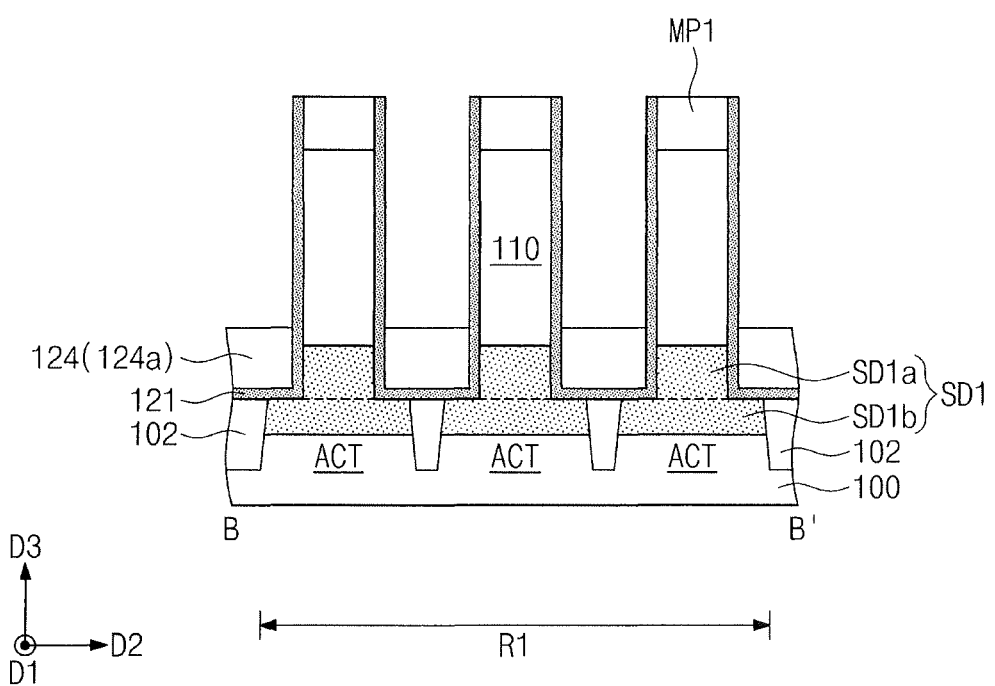

Referring to FIGS. 1, 9A, and 9B, an etching process may be performed to etch the first buried segment 124a and the sacrificial pattern 127. When the etching process is performed, the first buried segment 124a may be partially etched, and the sacrificial pattern 127 may be removed. The etching process may have an etch selectivity to the first and second line layers 121 and 125. As the second buried segment 124b is covered with the second line layer 125, the second buried segment 124b may not be etched during the etching process.

In some embodiments, the first buried segment 124a remaining after the etching process may have a top surface whose level is higher than that of a top surface of the second buried segment 124b and lower than that of a top surface of a portion, which covers the second buried segment 124b, of the second line layer 125. The present inventive concepts, however, are not limited thereto.

Figure 10A:
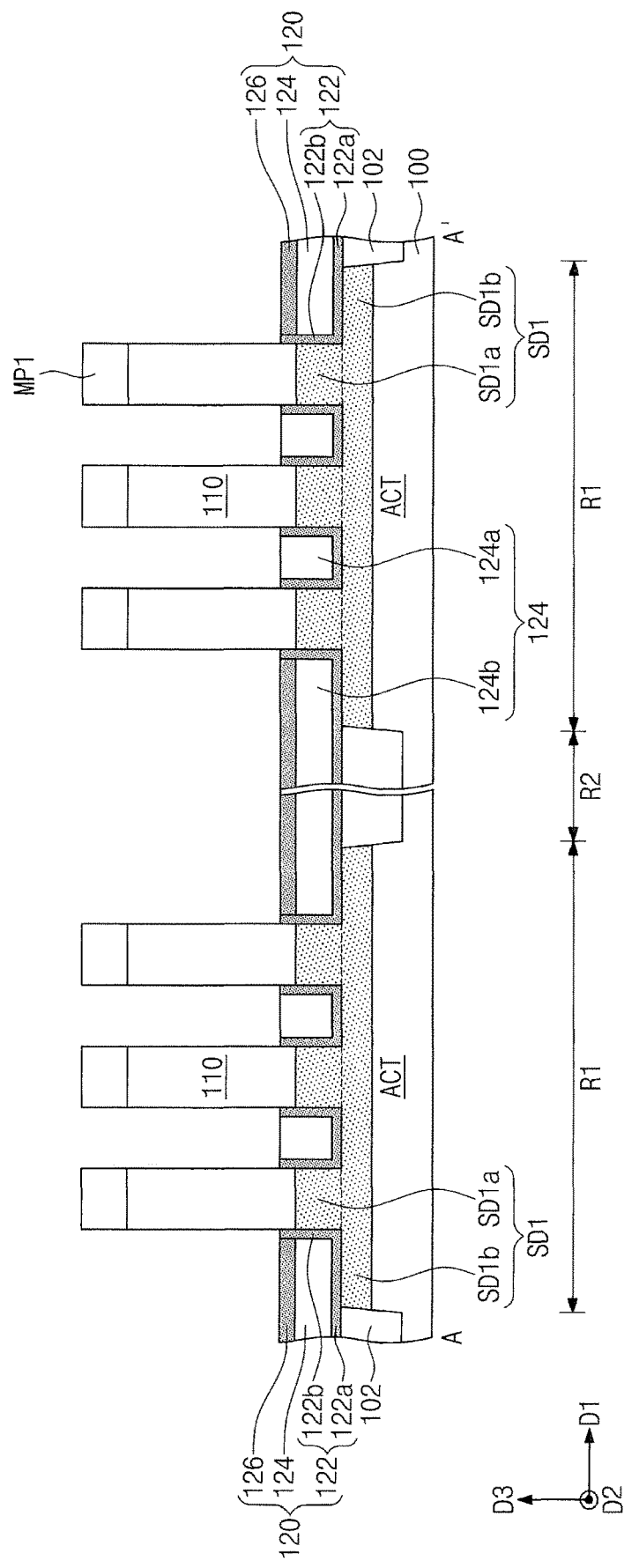
Figure 10B:
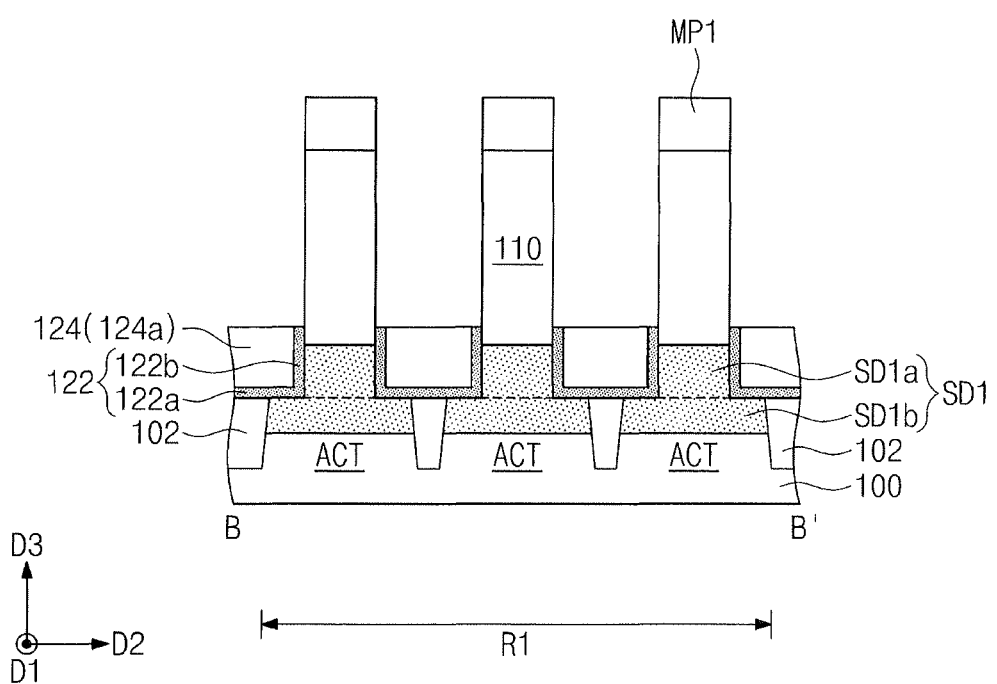

Referring to FIGS. 1, 10A, and 10B, the first and second line layers 121 and 125 may experience a partial etching process to form a first line pattern 122 and a second line pattern 126. For example, the first and second line layers 121 and 125 may be etched on their exposed portions beyond the top surface of the first buried segment 124a. As a result, the sidewalls of the active patterns 110 may be exposed. The partial etching process on the first and second line layers 121 and 125 may have an etch selectivity to the active patterns 110 and the buried pattern 124. The first line pattern 122, the buried pattern 124, and the second line pattern 126 may constitute a lower insulation structure 120.

The first line pattern 122 may include a horizontal segment 122a that covers the top surfaces of the substrate 100 and the device isolation layer 102 and vertical segments 122b that extend onto lower sidewalls of the active patterns 110. The vertical segments 122b of the first line pattern 122 may have top surfaces whose levels are substantially the same level as that of the top surface of the first buried segment 124a.

The second line pattern 126 may be disposed on the second buried segment 124b. The second line pattern 126 may have a top surface whose level is substantially the same as that of the top surface of the first buried segment 124a.

Figure 11A:
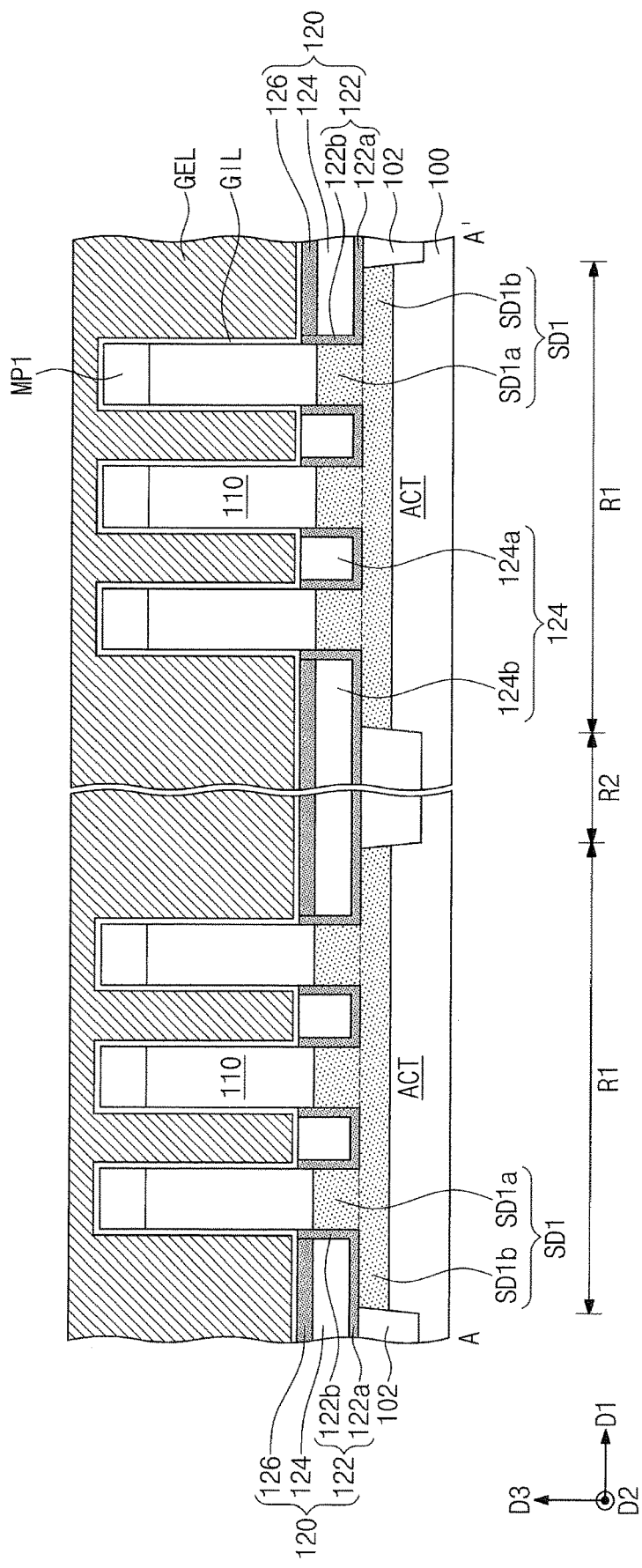
Figure 11B:
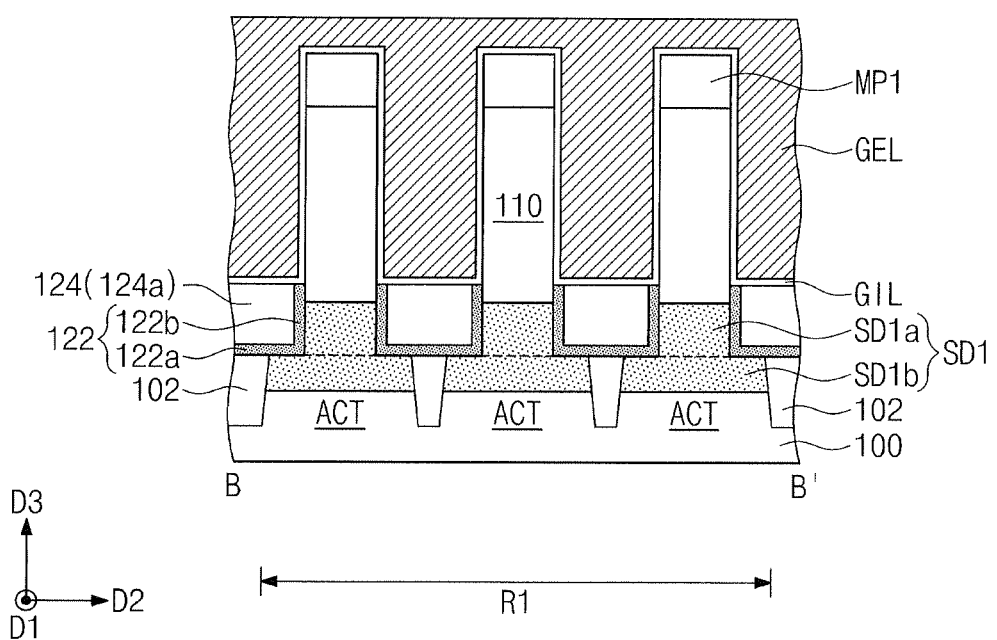

Referring to FIGS. 1, 11A, and 11B, a gate dielectric layer GIL may be formed to conformally cover a top surface of the lower insulation structure 120 and the exposed sidewalls of the active patterns 110. The gate dielectric layer GIL may extend onto the first mask patterns MP1. For example, the gate dielectric layer GIL may be formed using a CVD process or an ALD process. The gate dielectric layer GIL may include, for example, silicon oxide, silicon oxynitride, and/or high-k dielectric.

A gate electrode layer GEL may be formed on the gate dielectric layer GIL. The gate electrode layer GEL may be formed to cover the lower insulation structure 120 and the active patterns 110. For example, the gate electrode layer GEL may be formed using a CVD process, an ALD process, a physical vapor deposition (PVD) process. The gate electrode layer GEL may include, for example, one or more of metal and conductive metal nitride.

Figure 12A:
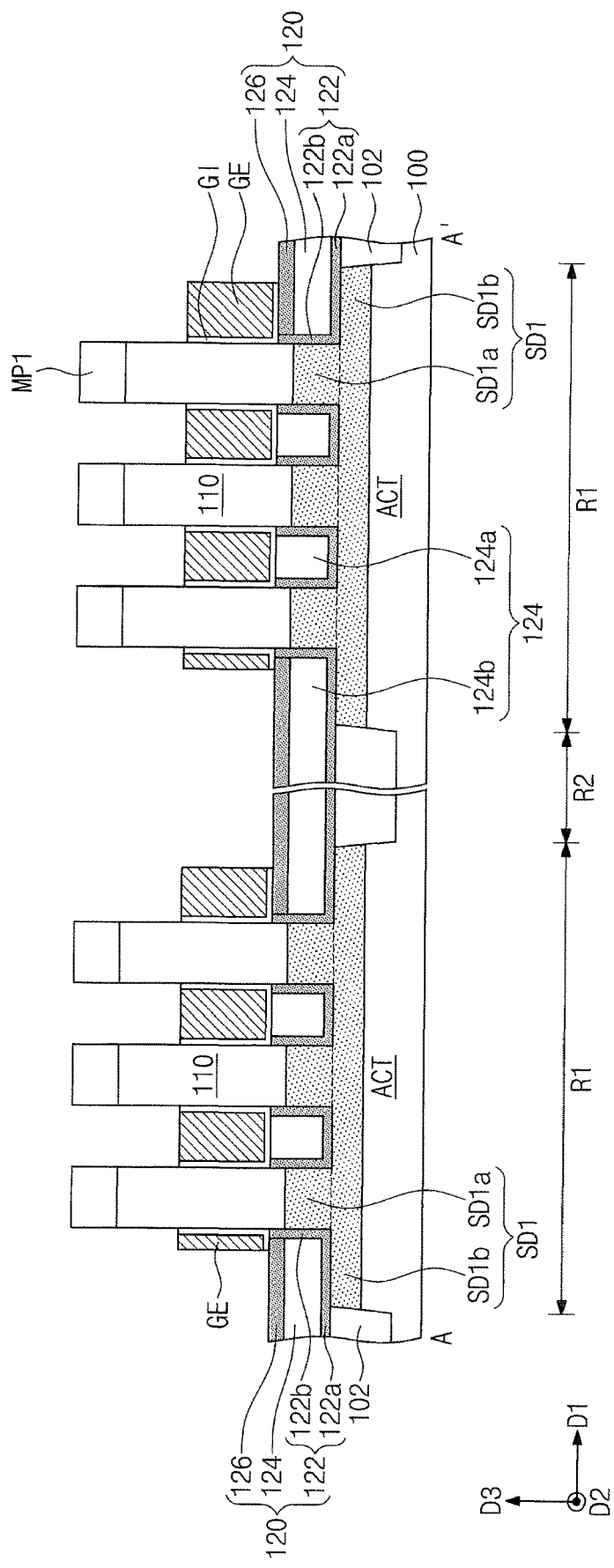
Figure 12B:
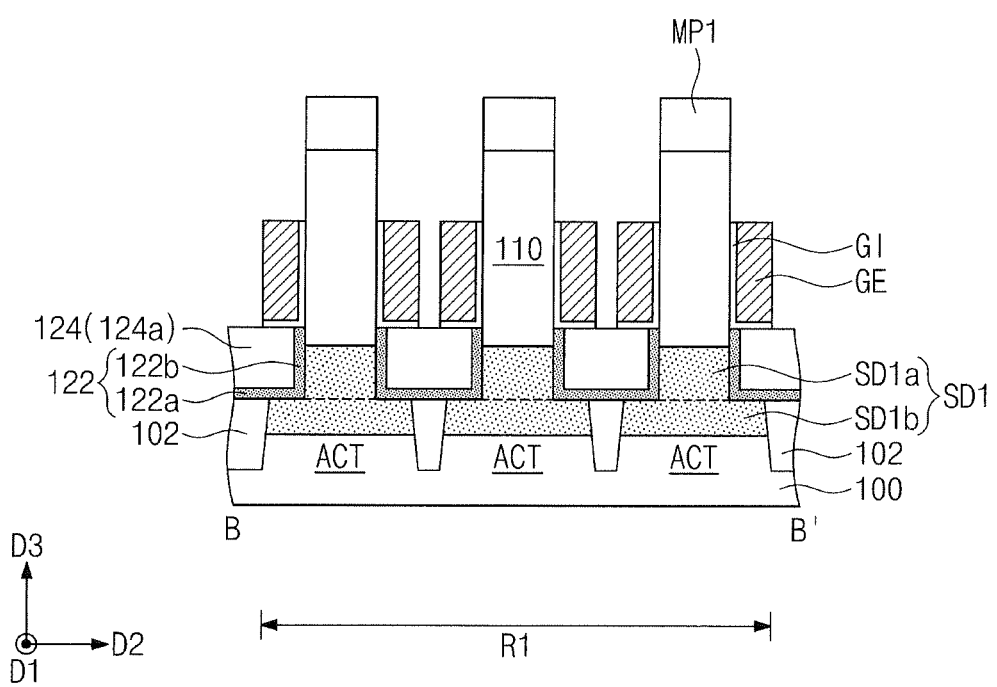

Referring to FIGS. 1, 12A, and 12B, the gate dielectric layer GIL and the gate electrode layer GEL may be patterned to form gate dielectric patterns GI and gate electrodes GE.

When viewed in plan, the gate electrodes GE may be formed to correspond to the active regions ACT. When viewed in plan, each of the gate electrodes GE may surround the sidewalls of the active patterns 110 provided on one active region ACT. The gate electrodes GE may have top surfaces whose levels are lower than those of top surfaces of the active patterns 110.

The gate dielectric patterns GI may be formed from the gate dielectric layer GIL. The gate dielectric patterns GI may be confined between the gate electrodes GE and the active patterns 110 and between the gate electrodes GE and the lower insulation structure 120.

Figure 13A:
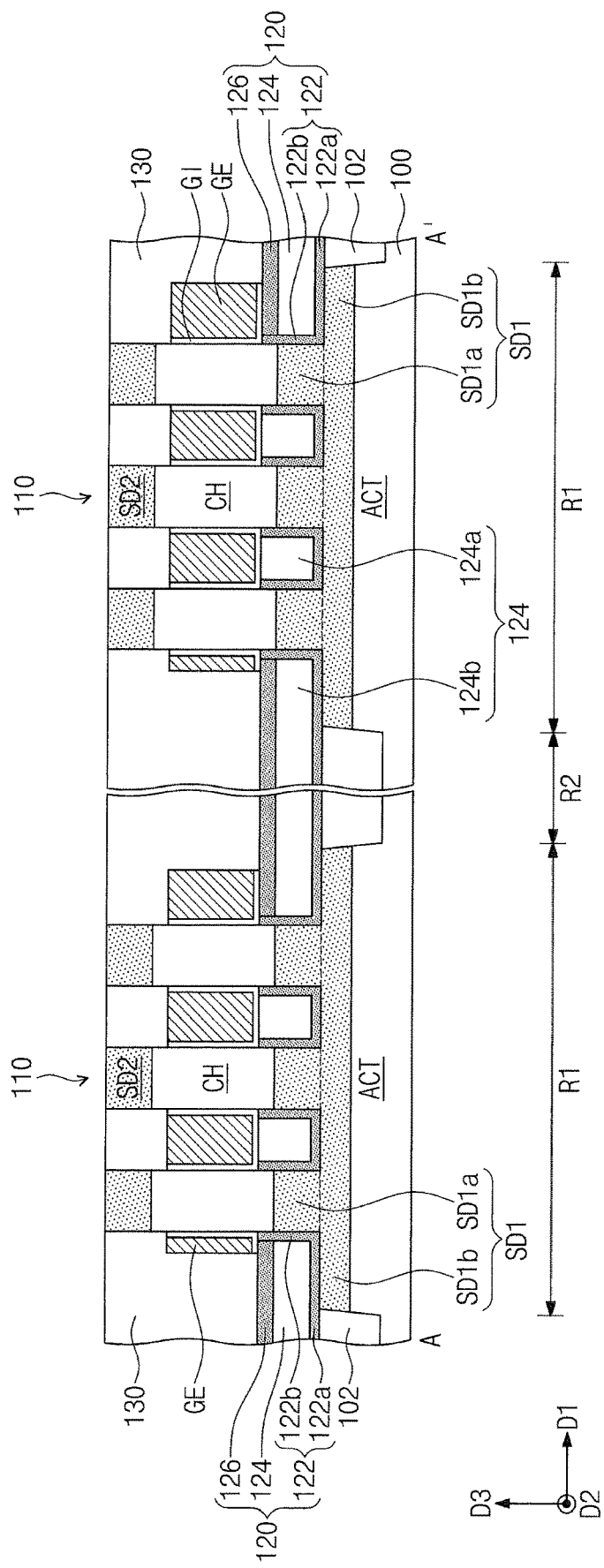
Figure 13B:
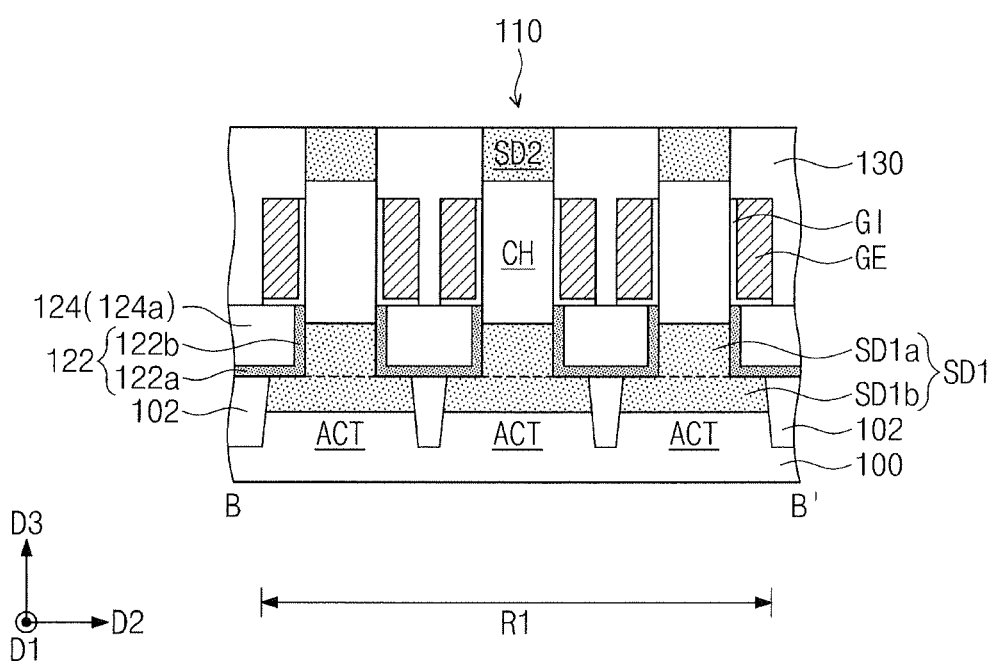

Referring to FIGS. 1, 13A, and 13B, a first interlayer dielectric layer 130 may be formed on the lower insulation structure 120. The first interlayer dielectric layer 130 may cover the gate electrodes GE and upper sidewalls of the active patterns 110 protruding from the top surfaces of the gate electrodes GE. The formation of the first interlayer dielectric layer 130 may include forming an insulation layer (not shown) to cover the active patterns 110 and the gate electrodes GE and performing a planarization process on the insulation layer until the top surfaces of the active patterns 110 are exposed.

Second source/drains SD2 may be formed at upper portions of the active patterns 110. In some embodiments, the formation of the second source/drains SD2 may include implanting impurities into the upper portions of the active patterns 110. For example, an ion implantation process may be employed to form the second source/drains SD2. In other embodiments, the second source/drains SD2 may be formed using a selective epitaxial growth process in which the upper portions of the active patterns 110 are used as seeds. The second source/drains SD2 may be formed such that each of the active patterns 110 may include therein a channel CH defined between the first source/drain SD1 and the second source/drain SD2.

Referring back to FIGS. 1, 2A, and 2B, a second interlayer dielectric layer 132 may be formed on the first interlayer dielectric layer 130. The second interlayer dielectric layer 132 may cover a top surface of the first interlayer dielectric layer 130 and the top surfaces of the active patterns 110. For example, the second interlayer dielectric layer 132 may include silicon oxide, silicon nitride, and/or silicon oxynitride.

First upper contacts 140 may be formed to come into connection with the second source/drains SD2, second upper contacts 142 may be formed to come into connection with the gate electrodes GE, and third upper contacts 144 may be formed to come into connection with the first source/drains SD1. The first to third upper contacts 140, 142, and 144 may include one or more of metal and conductive metal nitride.

Figure 14A:
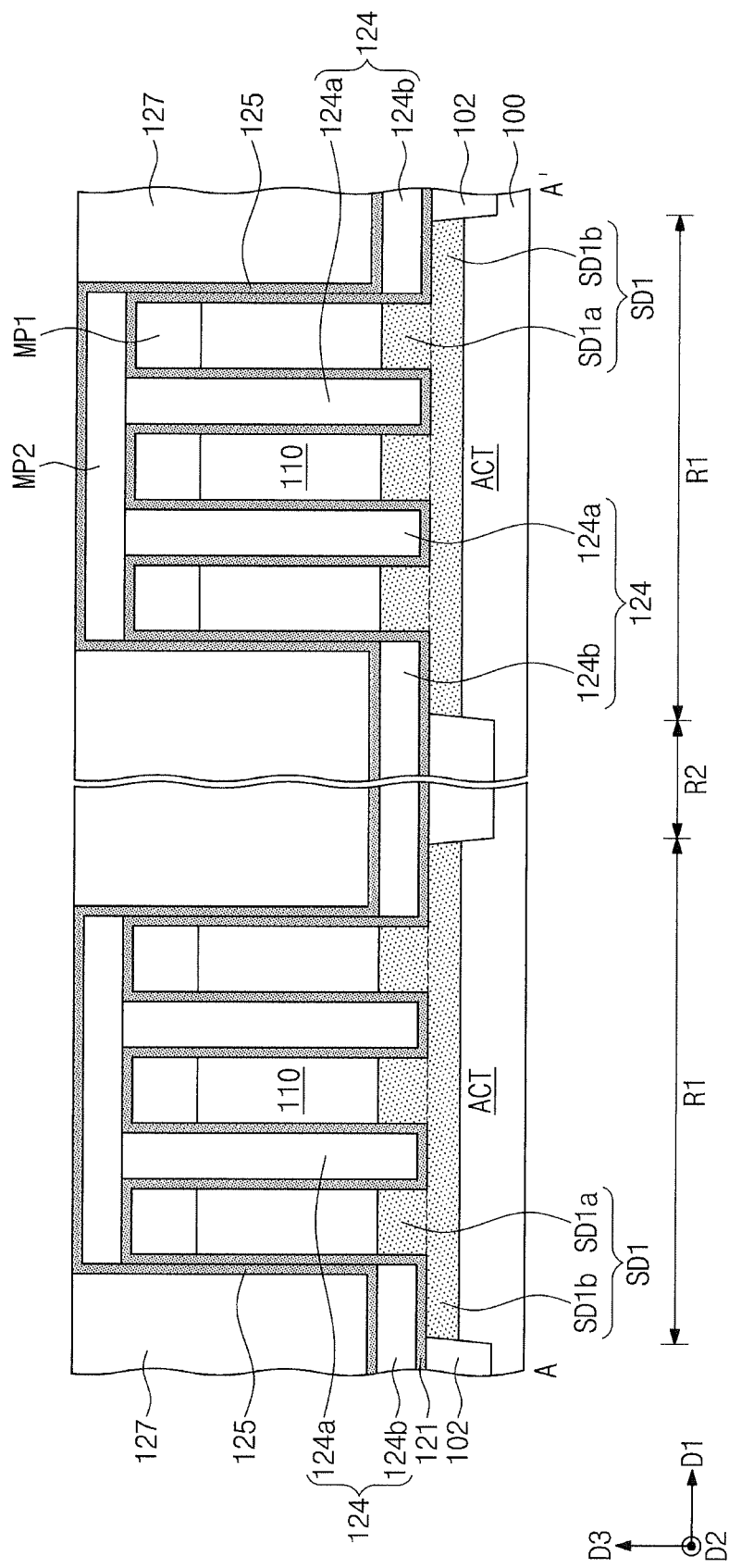
FIGS. 14A, 14B, 15A, and 15B illustrate cross-sectional views showing a method of fabricating a semiconductor device according to exemplary embodiments of the present inventive concepts.
Figure 14B:
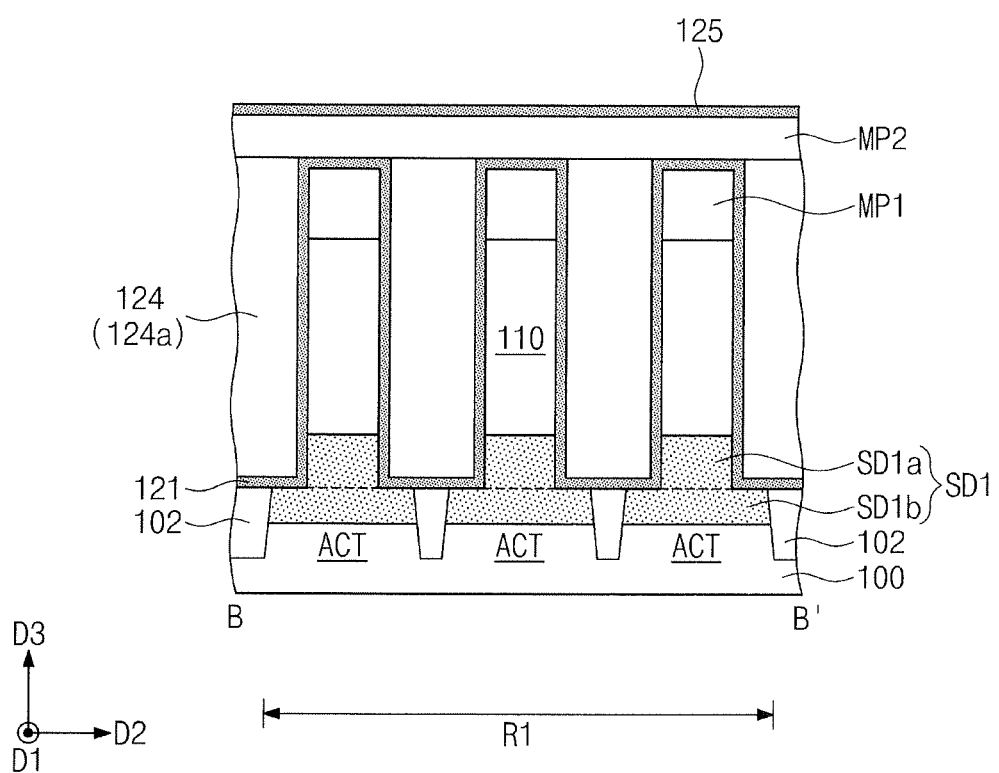
Figure 15A:
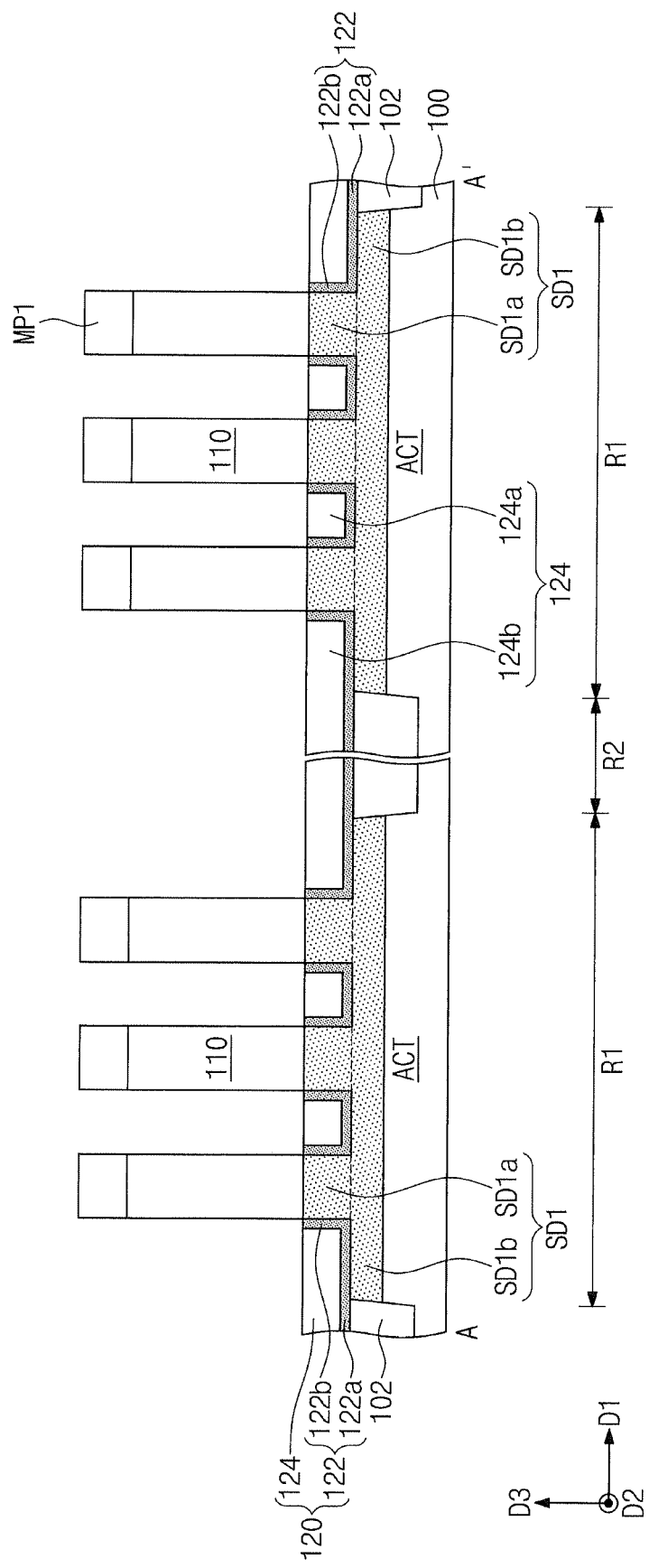
Figure 15B:
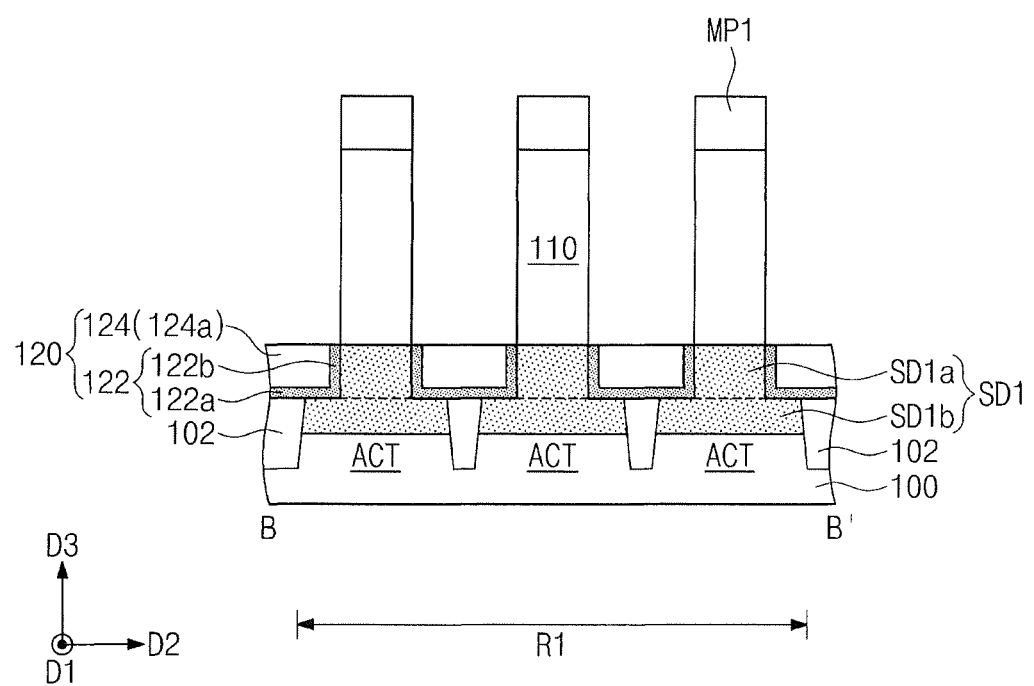

FIGS. 14A, 14B, 15A, and 15B illustrate cross-sectional views showing a method of fabricating a semiconductor device according to exemplary embodiments of the present inventive concepts. For example, FIGS. 14A and 15A illustrate cross-sectional views taken along line A-A' of FIG. 1, and FIGS. 14B and 15B illustrates cross-sectional views taken along line B-B' of FIG. 1. In the embodiments that follow, components substantially the same as those discussed with reference to FIGS. 1, 3A, and 3B may be allocated the same reference numerals thereto, and a repetitive description thereof may be omitted.

FIGS. 14A and 14B may correspond to a process after the processes discussed with reference to FIGS. 1, 6A, and 6B.

Referring to FIGS. 1, 14A, and 14B, a second line layer 125 may be formed. The second line layer 125 may cover the top surface of the second buried segment 124b, top surfaces of the second mask patterns MP2, and the first line layer 121 exposed beneath the second mask patterns MP2. For example, the second line layer 125 may be formed using a CVD process or an ALD process. The second line layer 125 may include, for example, silicon nitride, silicon oxynitride, silicon carbon nitride, silicon carbide, and/or silicon oxycarbide.

In some embodiments, as illustrated in FIG. 14A, the second line layer 125 may be formed by a deposition process having an excellent step coverage. Accordingly, a thickness of the second line layer 125 on the top surface of the second buried segment 124b and top surfaces of the second mask patterns MP2 may be substantially the same as that of the second line layer 125 on the sidewalls of the active patterns 110 and sidewalls of the first buried segment 124a.

Thereafter, there will be performed processes substantially the same as those discussed with reference to FIGS. 1, 8A, 8B, 9A, and 9B. In the present embodiment, after the etching process to etch the first buried segment 124a and the sacrificial pattern 127 discussed with reference to FIGS. 9A and 9B, the top surface level of the first buried segment 124a may be substantially the same as that of the second buried segment 124b.

Referring to FIGS. 1, 15A, and 15B, the first line layer 121 may experience a partial etching process to form a first line pattern 122. For example, the first line layer 121 may be etched on its exposed portion beyond the top surface of the first buried segment 124a. Unlike that discussed with reference to FIGS. 10A and 10B, the partial etching process may remove the second line layer 125. This may be caused by that a thickness of the second line layer 125 on the top surface of the second buried segment 124b and the top surfaces of the second mask patterns MP2 is substantially the same as or similar to that of the second line layer 125 on the sidewalls of the active patterns 110 and the sidewalls of the first buried segment 124a. The partial etching process on the first line layer 121 may have an etch selectivity to the active patterns 110 and the buried pattern 124. The first line pattern 122 and the buried pattern 124 may constitute a lower insulation structure 120.

The first line pattern 122 may include a horizontal segment 122a that covers the top surfaces of the substrate 100 and the device isolation layer 102 and the vertical segments 122b that extend onto lower sidewalls of the active patterns 110. The vertical segments 122b of the first line pattern 122 may have top surfaces whose levels are substantially the same as that of the top surface of the first buried segment 124a.

After that, there will be performed processes substantially the same as those discussed with reference to FIGS. 1, 11A to 13A, and 11B to 13B.

Figure 16:
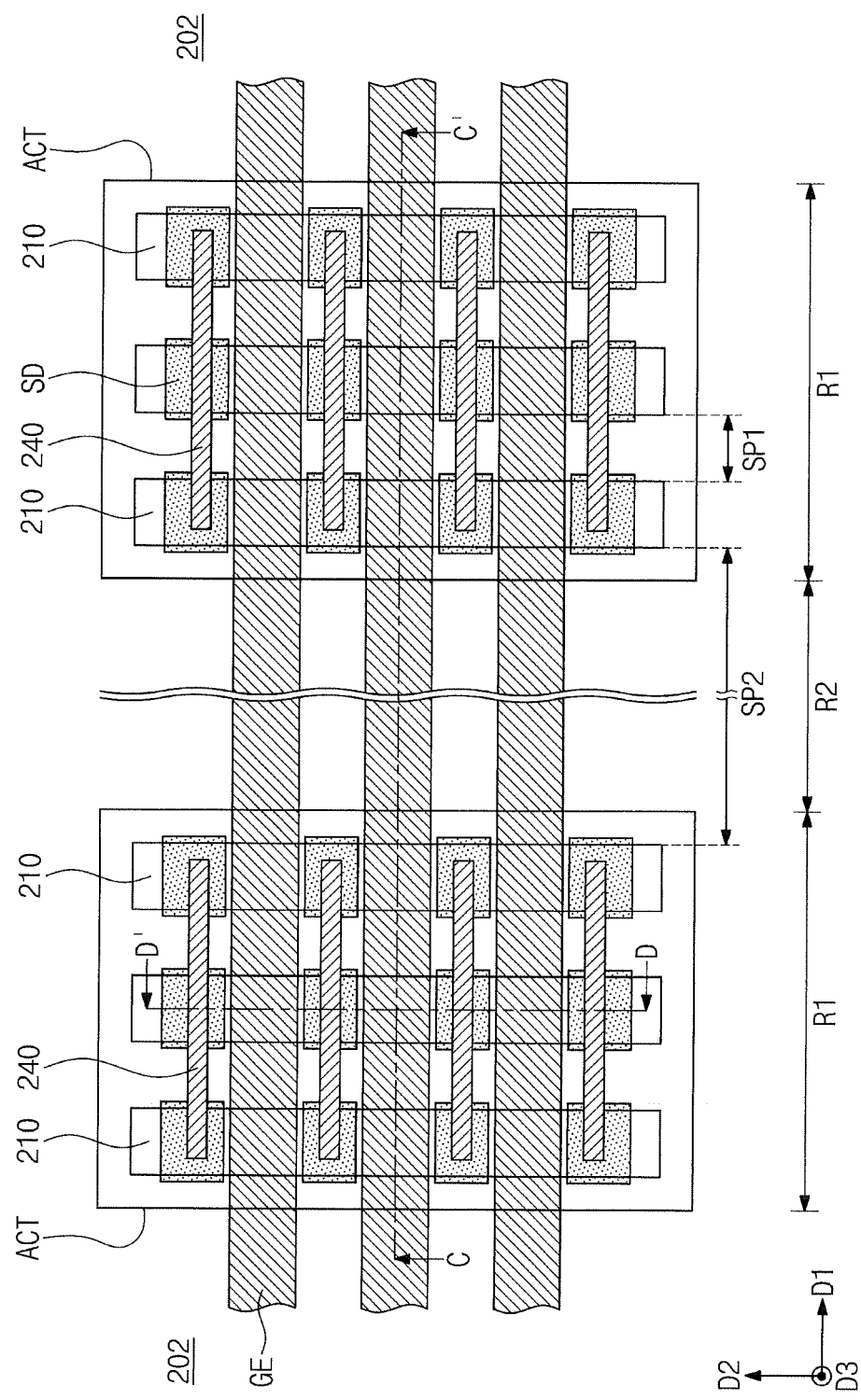
FIG. 16 illustrates a plan view showing a semiconductor device according to exemplary embodiments of the present inventive concepts.
Figure 17A:
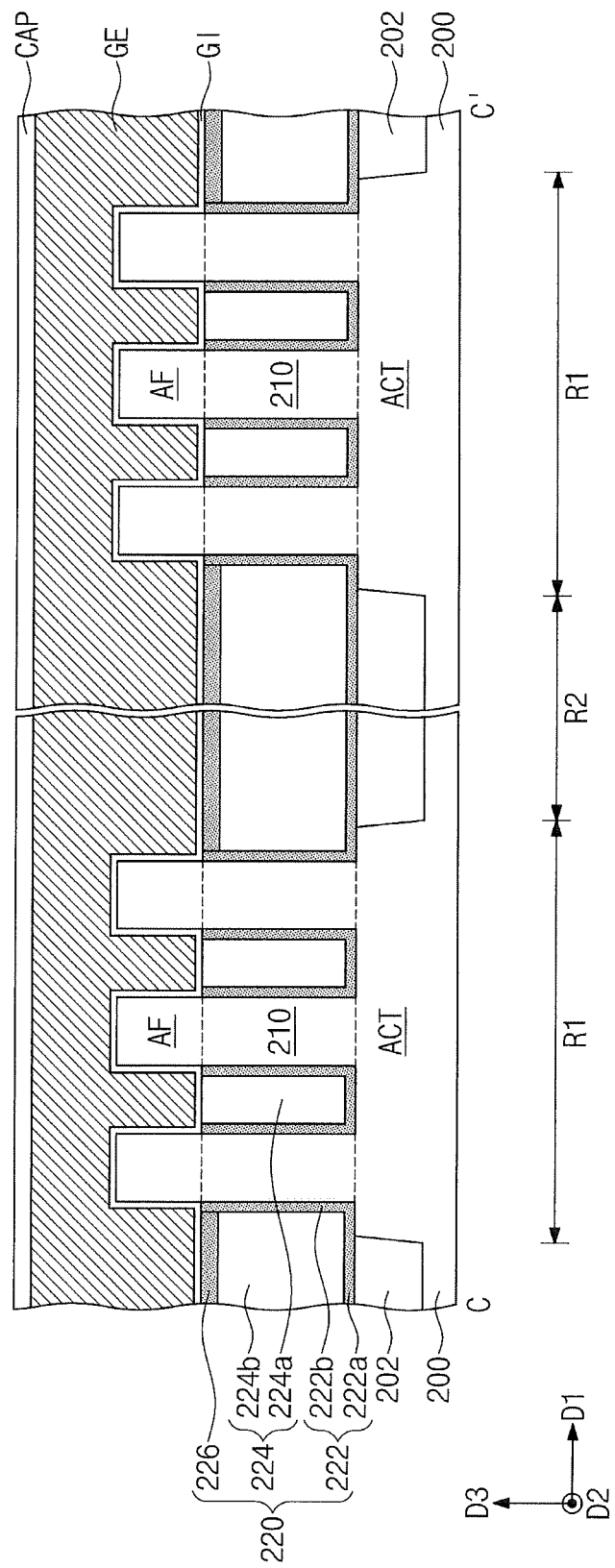
FIGS. 17A and 17B illustrate cross-sectional views showing a semiconductor device according to exemplary embodiments of the present inventive concepts.
Figure 17B:
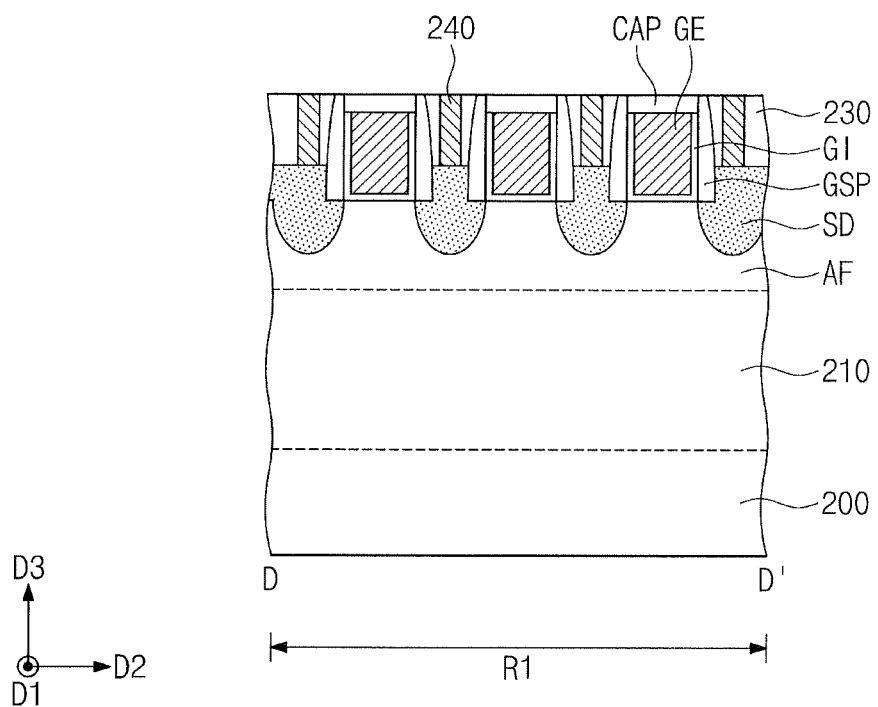

FIG. 16 illustrates a plan view showing a semiconductor device according to exemplary embodiments of the present inventive concepts. FIGS. 17A and 17B illustrate cross-sectional views showing a semiconductor device according to exemplary embodiments of the present inventive concepts. For example, FIG. 17A illustrates a cross-sectional view taken along line C-C' of FIG. 16, and FIG. 17B illustrates a cross-sectional view taken along line D-D' of FIG. 16.

Referring to FIGS. 16, 17A, and 17B, a substrate 200 may be provided. The substrate 200 may be a semiconductor substrate. The substrate 200 may include first regions R1 spaced apart from each other in a first direction D1 and a second region R2 between the first regions R1. Each of the first and second regions R1 and R2 may extend in a second direction D2 crossing (e.g., perpendicular to) the first direction D1.

The substrate 200 may be provided therein with a device isolation layer 202 that defines active regions ACT. For example, when viewed in plan, the substrate 200 may have the active region ACT at its portion surrounded by the device isolation layer 202. The device isolation layer 202 may be provided to have a predetermined depth from a top surface of the substrate 200. The device isolation layer 202 may include, for example, silicon oxide, silicon nitride, and/or silicon oxynitride. The active regions ACT may be defined in the first regions R1 and may extend in the second direction D2.

Active patterns 210 may be provided on the first regions R1. Each of the active patterns 210 may protrude from the top surface (or the active region ACT) of the substrate 200. For example, each of the active patterns 210 may extend in a third direction D3 perpendicular to the top surface of the substrate 200. When viewed in plan, each of the active patterns 210 may extend in the second direction D2.

The active patterns 210 may be provided on the active regions ACT. A plurality of the active patterns 210 may be provided on one active region ACT. For example, as illustrated in FIGS. 16 and 17A, three active patterns 110 may be provided on one active region ACT. The present inventive concepts, however, are not limited thereto. The active patterns 210 may be spaced apart from each other in the first direction D1 on one active region ACT. A spacing SP1 between the active patterns 210 provided on the same first region R1 may be less than a spacing SP2 between the active patterns 210 provided on different first regions R1.

A lower insulation structure 220 may be provided on the substrate 200. The lower insulation structure 220 may cover the top surface of the substrate 200, a top surface of the device isolation layer 202, and lower sidewalls of the active patterns 210. The lower insulation structure 220 may be similar to the lower insulation structure 120 discussed with reference to FIGS. 1, 2A, and 2B.

For example, the lower insulation structure 220 may include a first line pattern 222, a buried pattern 224, and a second line pattern 226. The first and second line patterns 222 and 226 may have an etch selectivity to the buried pattern 224.

The first line pattern 222 may conformally cover the top surface of the substrate 200, the top surface of the device isolation layer 202, and the lower sidewalls of the active patterns 210. In such a configuration, the first line pattern 222 may include a horizontal segment 222a that covers the top surfaces of the substrate 200 and the device isolation layer 202 and vertical segments 222b that cover the lower sidewalls of the active patterns 210. The vertical segments 222b may protrude from the horizontal segment 222a and may extend in the third direction D3. The vertical segments 222b may have top surfaces at substantially the same level.

The buried pattern 224 may be provided on the first line pattern 222. The buried pattern 224 may include a first buried segment 224a and a second buried segment 224b. When viewed in plan, the first buried segment 224a may be provided between the active patterns 210 provided on the same first region R1, and the second buried segment 224b may be provided outside the active patterns 210 provided on the same first region R1. For example, the second buried segment 224b may be provided between the active patterns 210 provided on different first regions R1. The first buried segment 224a may have a top surface whose level is substantially the same as those of top surfaces of the vertical segments 222b.

In some embodiments, as illustrated in FIG. 17A, the top surface of the first buried segment 224a may be located at a level different from that of a top surface of the second buried segment 224b. For example, the top surface level of the first buried segment 224a may be higher than that of the second buried segment 224b. The present inventive concepts, however, are not limited thereto.

The second line pattern 226 may be provided on the buried pattern 224. When viewed in plan, the second line pattern 226 may be provided outside, but not between, the active patterns 210 provided on the same first region R1. For example, the second line pattern 226 may be provided on the top surface of the second buried segment 224b, but not on the top surface of the first buried segment 224a. The second line pattern 226 may be connected to some but not all of the vertical segments 222b. The second line pattern 226 may have a top surface whose level is substantially the same as that of the top surface of the first buried segment 224a.

An upper portion of each active pattern 210 may protrude from a top surface of the lower insulation structure 220. An active fin AF may be defined by the upper portion of each active pattern 210 protruding from the top surface of the lower insulation structure 220. As discussed above, since the top surface level of the first buried segment 224a is substantially the same as that of the second line pattern 226, the active fins AF of the active patterns 210 may have a uniform vertical height.

Gate electrodes GE may be provided on the lower insulation structure 220. Each of the gate electrodes GE may extend in the first direction D1 and may run across the active patterns 210. The gate electrodes GE may be spaced apart from each other in the second direction D2. The gate electrodes GE may include, for example, metal and/or conductive metal nitride.

A gate dielectric pattern GI may be provided beneath each of the gate electrodes GE. A capping pattern CAP may be provided to cover each of the gate electrodes GE. Gate spacers GSP may be provided on opposite sides of each of the gate electrodes GE. In some embodiments, the gate dielectric pattern GI may extend between the gate electrode GE and the gate spacers GSP corresponding to the gate electrode GE.

The gate dielectric pattern GI may include, for example, silicon oxide, silicon oxynitride, and/or high-k dielectric. The capping pattern CAP and the gate spacers GSP may include, for example, silicon oxide, silicon nitride, silicon oxynitride, silicon carbon nitride, and/or silicon carbon oxynitride.

Source/drains SD may be provided at upper portions of the active patterns 210 on opposite sides of each gate electrode GE. For example, the source/drains SD may be disposed at the active fins AF exposed on opposite sides of each gate electrode GE. The source/drains SD may include the same impurity-doped semiconductor material. For example, the source/drains SD may include a semiconductor material doped with one of n-type or p-type impurities.

In some embodiments, as illustrated in FIGS. 17A and 17B, the source/drains SD may be epitaxial layers grown from the active patterns 210 serving as seeds. In these embodiments, the active patterns 210 may have recessions on opposite sides of each gate electrode GE, and the source/drains SD may be provided in corresponding recessions.

In other embodiments, unlike that illustrated in FIGS. 17A and 17B, the source/drains SD may be impurity regions formed in the active fins AF on opposite sides of each gate electrode GE.

An interlayer dielectric layer 230 may be provided on the lower insulation structure 220. The interlayer dielectric layer 230 may cover the lower insulation structure 220, the source/drain regions SD, and the gate spacers GSP. The interlayer dielectric layer 230 may have a top surface coplanar with those of the capping patterns CAP, but the present inventive concepts are not limited thereto. The interlayer dielectric layer 230 may include, for example, silicon oxide, silicon nitride, and/or silicon oxynitride.

Upper contacts 240 may be provided in the interlayer dielectric layer 230. Each of the upper contacts 240 may penetrate the interlayer dielectric layer 230 to come into connection with the source/drains SD. In some embodiments, as illustrated in FIG. 16, each of the upper contacts 240 may be coupled in common to a plurality of the source/drains SD adjacent to each other in the first direction D1. The present inventive concepts, however, are not limited thereto. The upper contacts 240 may include, for example, metal and/or conductive metal nitride.

Figure 18A:
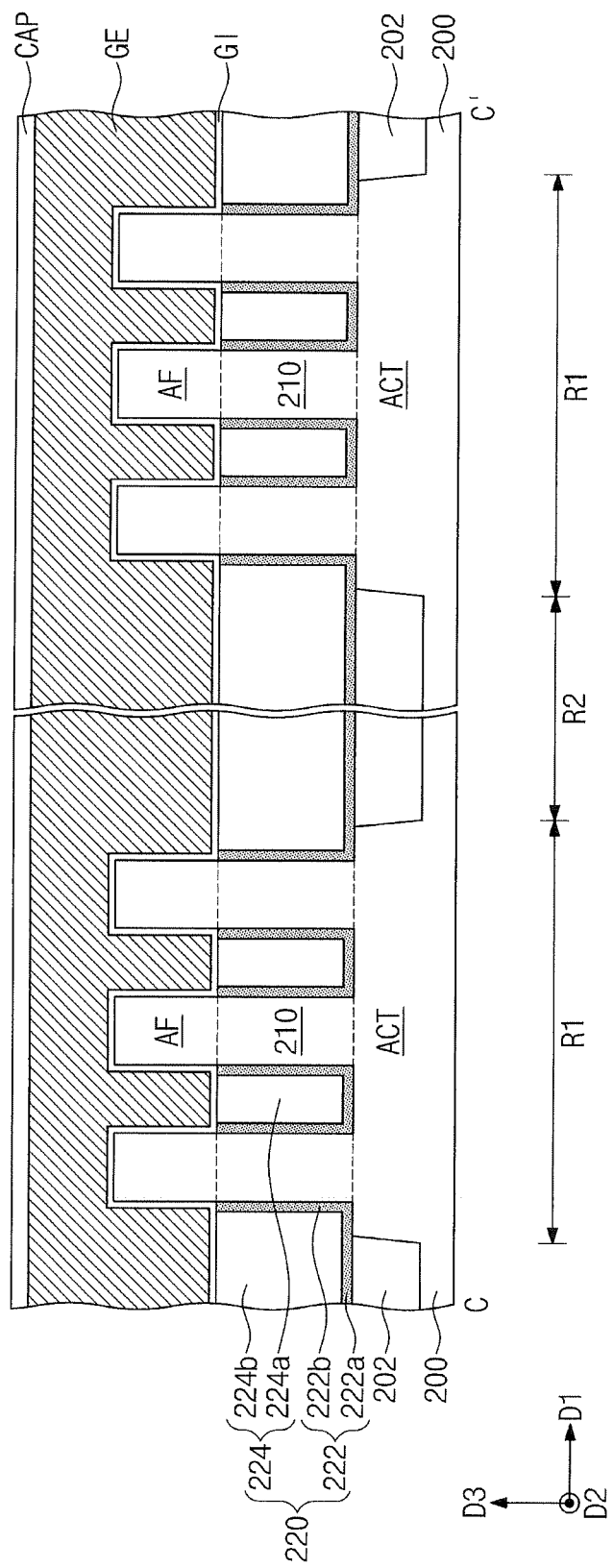
FIGS. 18A and 18B illustrate cross-sectional views showing a semiconductor device according to exemplary embodiments of the present inventive concepts.
Figure 18B:
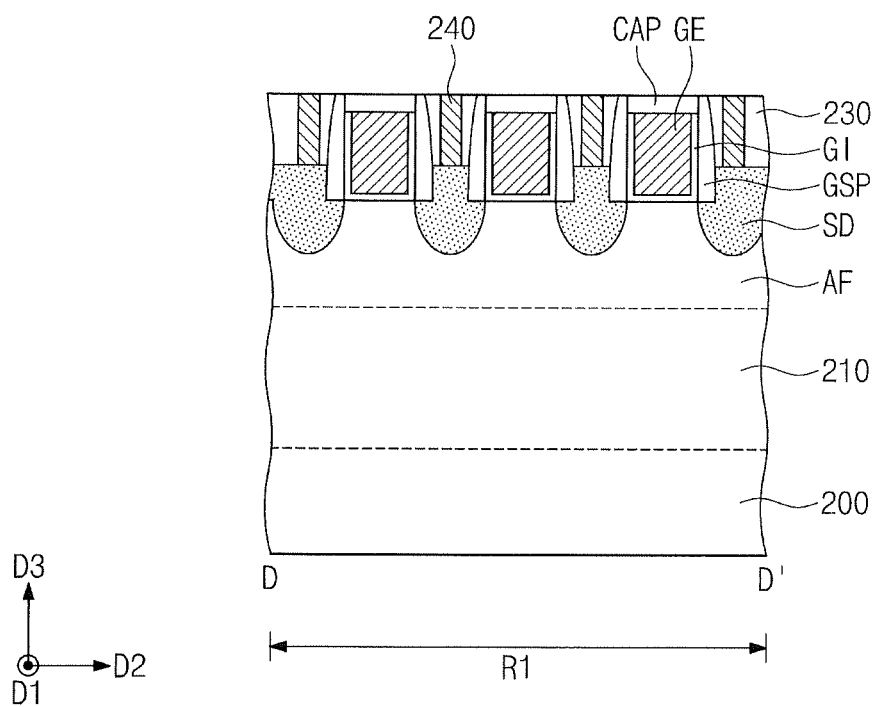

FIGS. 18A and 18B illustrate cross-sectional views showing a semiconductor device according to exemplary embodiments of the present inventive concepts. For example, FIG. 18A illustrates a cross-sectional view taken along line C-C' of FIG. 16, and FIG. 18B illustrates a cross-sectional view taken along line D-D' of FIG. 16. In the embodiments that follow, components substantially the same as those discussed with reference to FIGS. 16, 17A, and 17B may be allocated the same reference numerals thereto, and a repetitive description thereof may be omitted. The lower insulation structure 220 and its related components will be discussed hereinafter in detail.

Referring to FIGS. 16, 18A, and 18B, the lower insulation structure 220 may be provided on the substrate 200. The lower insulation structure 220 may cover the top surface of the substrate 200, the top surface of the device isolation layer 202, and the lower sidewalls of the active patterns 210. An upper portion of each active pattern 210 may protrude from the top surface of the lower insulation structure 220.

The lower insulation structure 220 may include the first line pattern 222 and the buried pattern 224. Unlike that discussed with reference to FIGS. 16, 17A, and 17B, the lower insulation structure 220 may include no second line pattern 226.

The first line pattern 222 may be configured substantially the same as that discussed with reference to FIGS. 16, 17A, and 17B.

The buried pattern 224 may be provided on the first line pattern 222. The buried pattern 224 may include the first buried segment 224a and the second buried segment 224b. When viewed in plan, the first buried segment 224a may be provided between the active patterns 210 provided on the same first region R1, and the second buried segment 224b may be provided outside the active patterns 210 provided on the same first region R1. For example, the second buried segment 224b may be provided between the active patterns 210 provided on different first regions R1.

As illustrated in FIG. 18A, the top surface of the first buried segment 224a may be located at substantially the same level as that of top surface of the second buried segment 224b. For example, the top surface levels of the first and second buried segments 224a and 224b may be substantially the same as those of the vertical segments 222b.

An upper portion of each active pattern 210 may protrude from the top surface of the lower insulation structure 220. The active fin AF may be defined by the upper portion of each active pattern 210 protruding from the top surface of the lower insulation structure 220. As discussed above, since the top surface level of the first buried segment 224a is substantially the same as that of the second line pattern 226, the active fins AF of the active patterns 210 may have a uniform vertical height.

FIGS. 19A to 24A and 19B to 24B illustrate cross-sectional views showing a method of fabricating a semiconductor device according to exemplary embodiments of the present inventive concepts. For example, FIGS. 19A to 24A illustrate cross-sectional views taken along line C-C' of FIG. 16, and FIGS. 19B to 24B illustrates cross-sectional views taken along line D-D' of FIG. 16. In the embodiments that follow, components substantially the same as those discussed with reference to FIGS. 16, 17A, and 17B may be allocated the same reference numerals thereto, and a repetitive description thereof may be omitted.

Figure 19A:
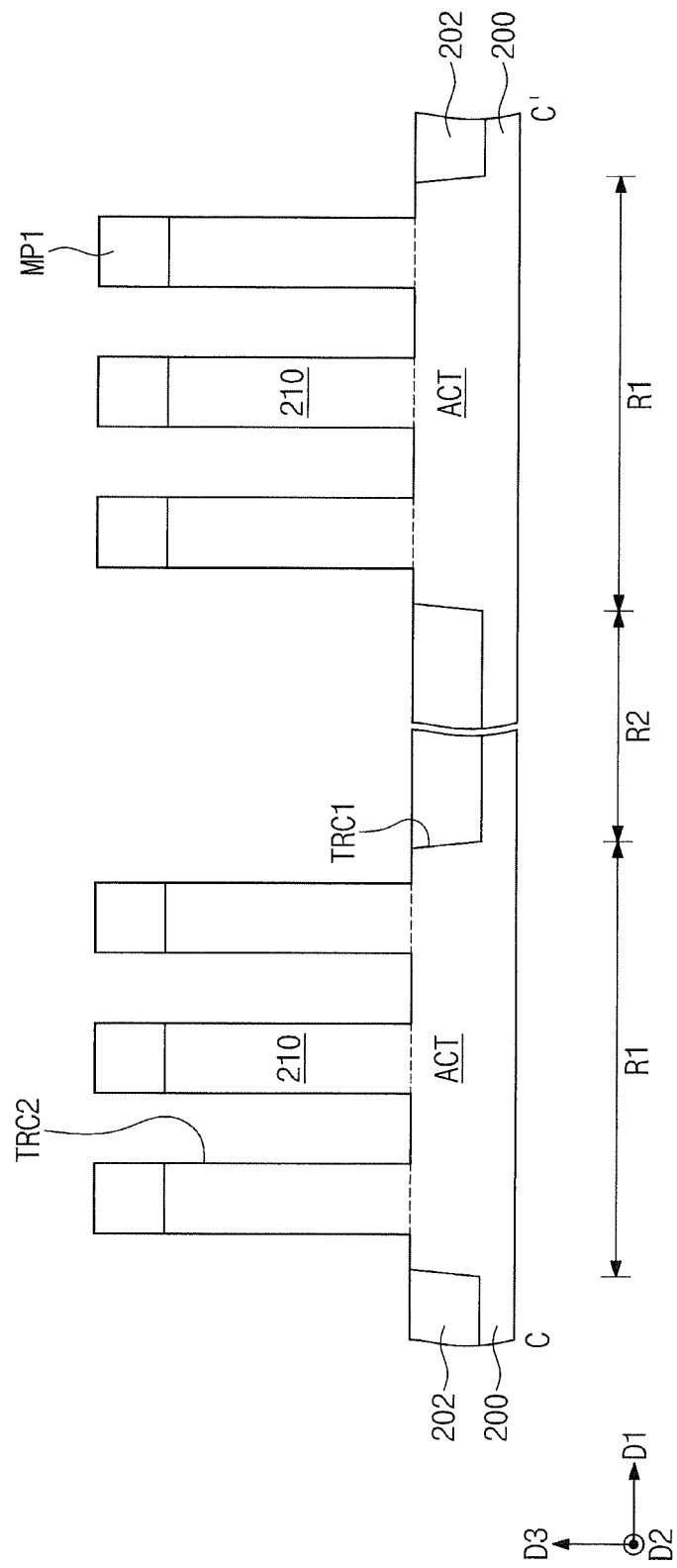
Figure 19B:
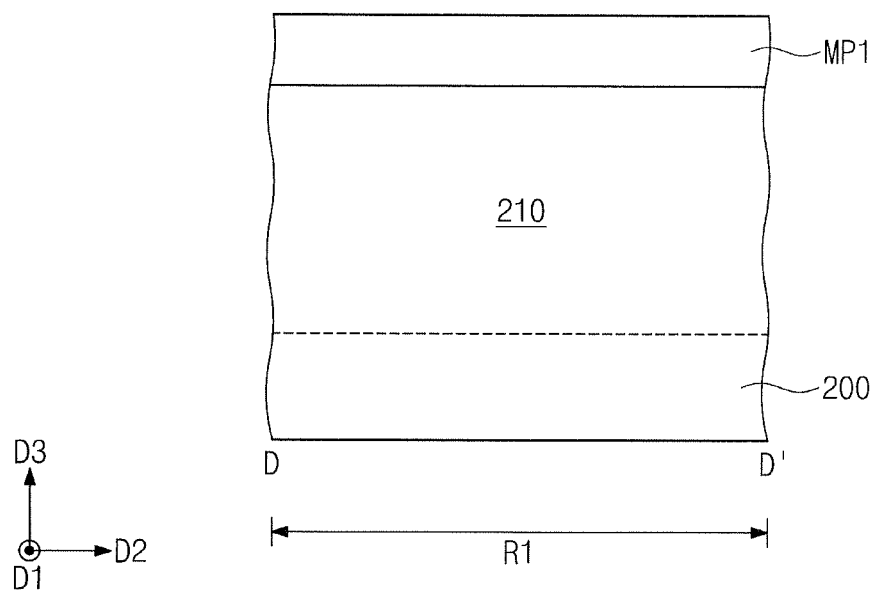

Referring to FIGS. 16, 19A, and 19B, a substrate 200 may be provided to include first regions R1 spaced apart from each other in a first direction D1 and a second region R2 between the first regions R1. Each of the first and second regions R1 and R2 may extend in a second direction D2 crossing (e.g., perpendicular to) the first direction D1.

A device isolation layer 202 may be formed in the substrate 200 to thereby define active regions ACT. The active regions ACT may be defined in corresponding first regions R1. The formation of the device isolation layer 202 may include forming a first trench TRC1 to define the active regions ACT and forming the device isolation layer 202 in the first trench TRC1.

Active patterns 210 may be formed on the first regions R1. The active patterns 210 may be formed on the active regions ACT. For example, as illustrated in FIGS. 16 and 19A, three active patterns 210 may be formed on one active region ACT. The present inventive concepts, however, are not limited thereto.

The formation of the active patterns 210 may include forming first mask patterns MP1 on the substrate 200 and performing an etching process to etch the substrate 200 using the first mask patterns MP1 as an etch mask. The etching process may form a second trench TRC2 defining the active patterns 210. The second trench TRC2 may have a floor surface whose level is higher than that of a floor surface of the first trench TRC1.

Figure 20A:
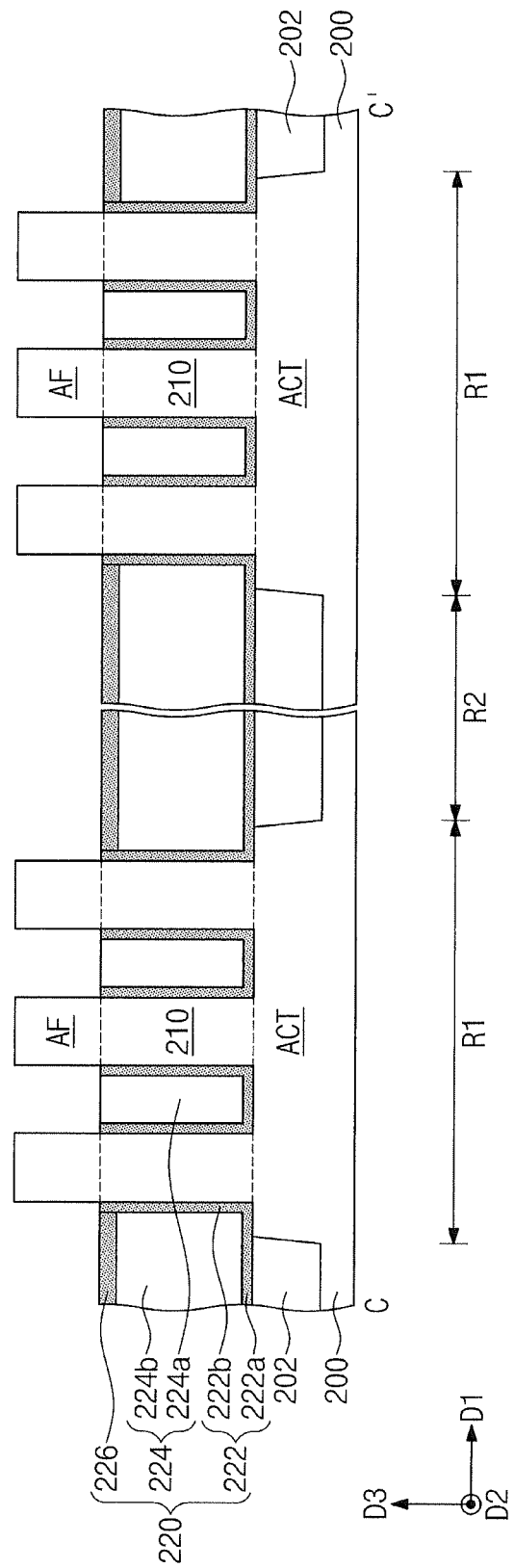
Figure 20B:
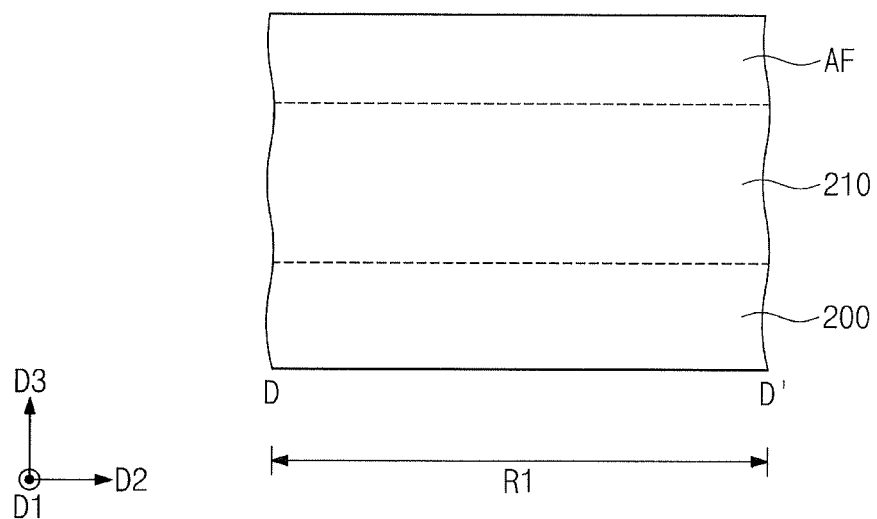

Referring to FIGS. 16, 20A, and 20B, a lower insulation structure 220 may be formed in the second trench TRC2.

In some embodiments, the formation of the lower insulation structure 220 may be substantially the same as the formation of the lower insulation structure 120 discussed with reference to FIGS. 5A to 10A and 5B to 10B. In these embodiments, as illustrated in FIGS. 20A and 20B, the lower insulation structure 220 may include a first line pattern 222, a buried pattern 224, and a second line pattern 226.

In other embodiments, the formation of the lower insulation structure 220 may be substantially the same as the formation of the lower insulation structure 120 discussed with reference to FIGS. 14A, 14B, 15A, and 15B. In these embodiments, unlike that illustrated in FIGS. 20A and 20B, the lower insulation structure 220 may include the first line pattern 222 and the buried pattern 224, but may not include the second line pattern 226.

An upper portion of each active pattern 210 may protrude from a top surface of the lower insulation structure 220. An active fin AF may be defined by the upper portion of each active pattern 210 protruding from the top surface of the lower insulation structure 220.

Figure 21A:
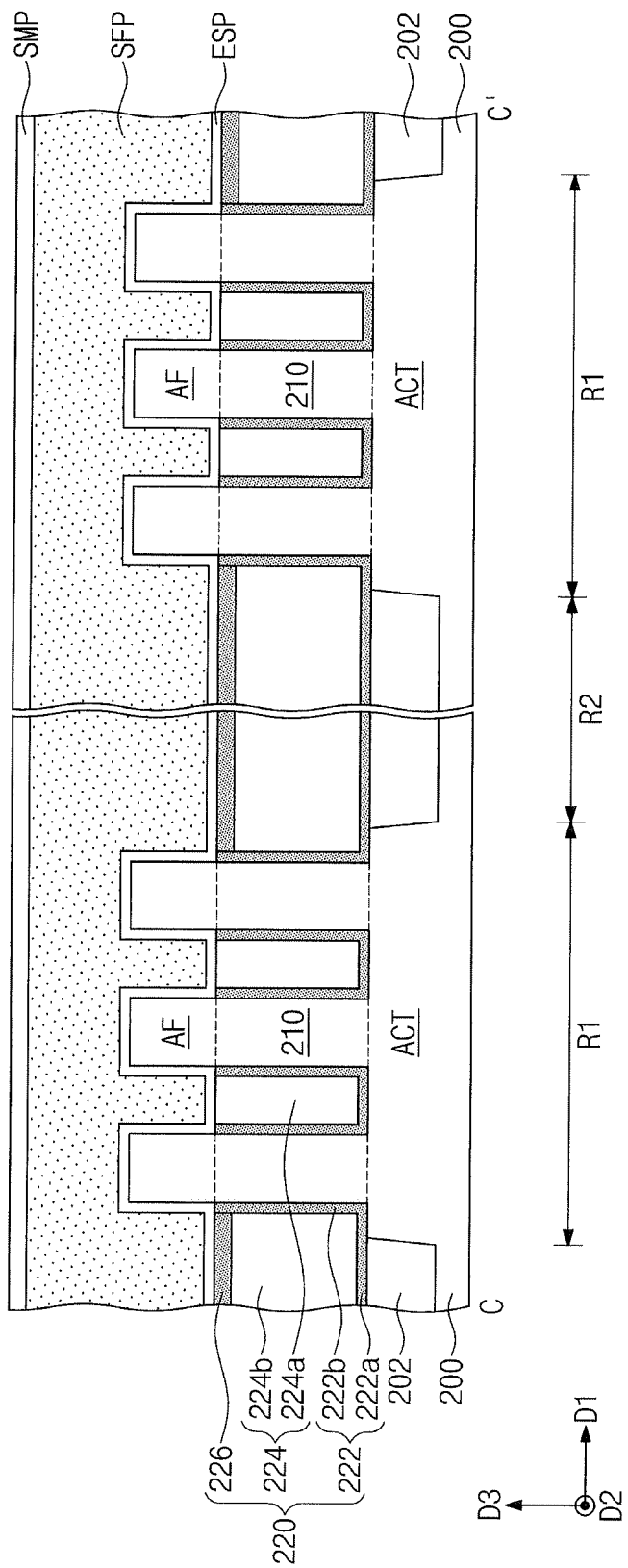
Figure 21B:
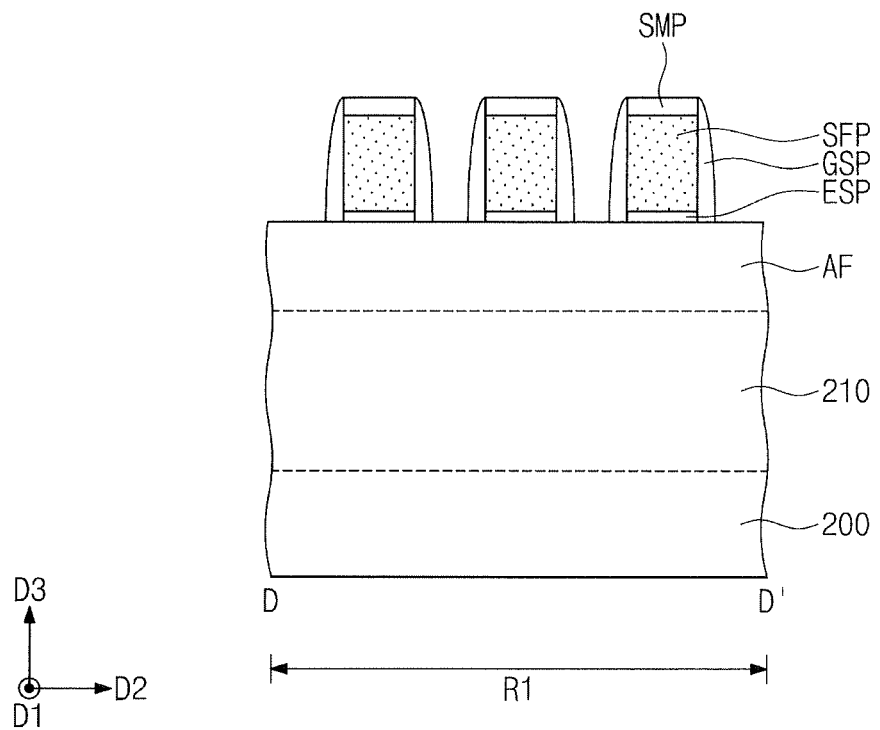

Referring to FIGS. 16, 21A, and 21B, etch stop patterns ESP and sacrificial patterns SFP may be formed on the lower insulation structure 220. The sacrificial patterns SFP may be formed on corresponding etch stop patterns ESP. The sacrificial patterns SFP may have an etch selectivity to the etch stop patterns ESP. For example, the sacrificial patterns SFP may include polysilicon, and the etch stop patterns ESP may include silicon oxide.

The formation of the etch stop patterns ESP and the sacrificial patterns SFP may include sequentially forming an etch stop layer (not shown) and a sacrificial layer (not shown) that cover the lower insulation structure 220 and the active fins AF, forming on the sacrificial layer sacrificial mask patterns SMP that extend in the first direction D1 and are spaced apart from each other in the second direction D2, and using the sacrificial mask patterns SMP as an etch mask to pattern the sacrificial layer and the etch stop layer. The active patterns 210 (or the active fins AF) may be partially exposed on opposite sides of each sacrificial pattern SFP.

Gate spacers GSP may be formed on sidewalls of the sacrificial patterns SFP. The formation of the gate spacers GSP may include forming a gate spacer layer (not shown) to conformally cover the substrate 200 on which the etch stop patterns ESP and the sacrificial patterns SFP are formed and anisotropically etching the gate spacer layer.

Figure 22A:
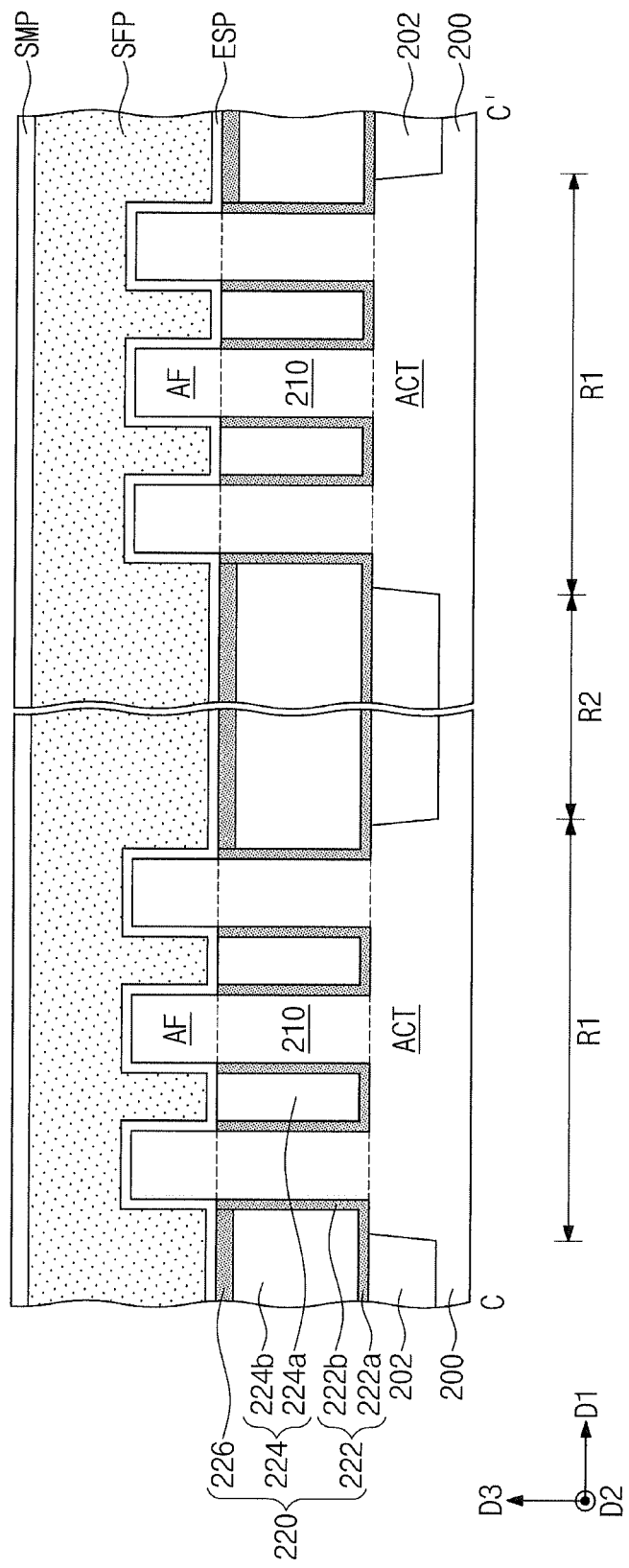
Figure 22B:
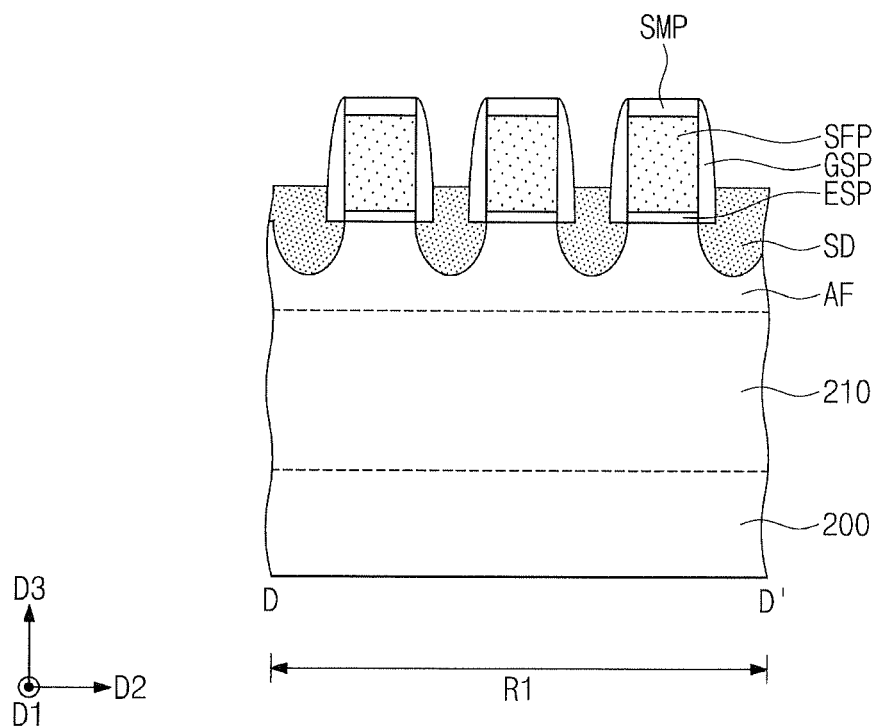

Referring to FIGS. 16, 22A, and 22B, source/drain regions SD may be formed on the active patterns 210 exposed on opposite sides of each sacrificial pattern SFP.

In some embodiments, as illustrated in FIGS. 22A and 22B, the formation of the source/drains SD may include removing upper portions (or, the active fins AF) of the active patterns 210 exposed on opposite sides of each sacrificial pattern SFP and performing a selective epitaxial growth process in which the active patterns 210, whose upper portions are removed, are used as seeds.

In other embodiments, unlike that illustrated in FIGS. 22A and 22B, the formation of the source/drains SD may include performing an ion implantation process on the upper portions (or, the active fins AF) of the active patterns 210 exposed on opposite sides of each sacrificial pattern SFP.

Figure 23A:
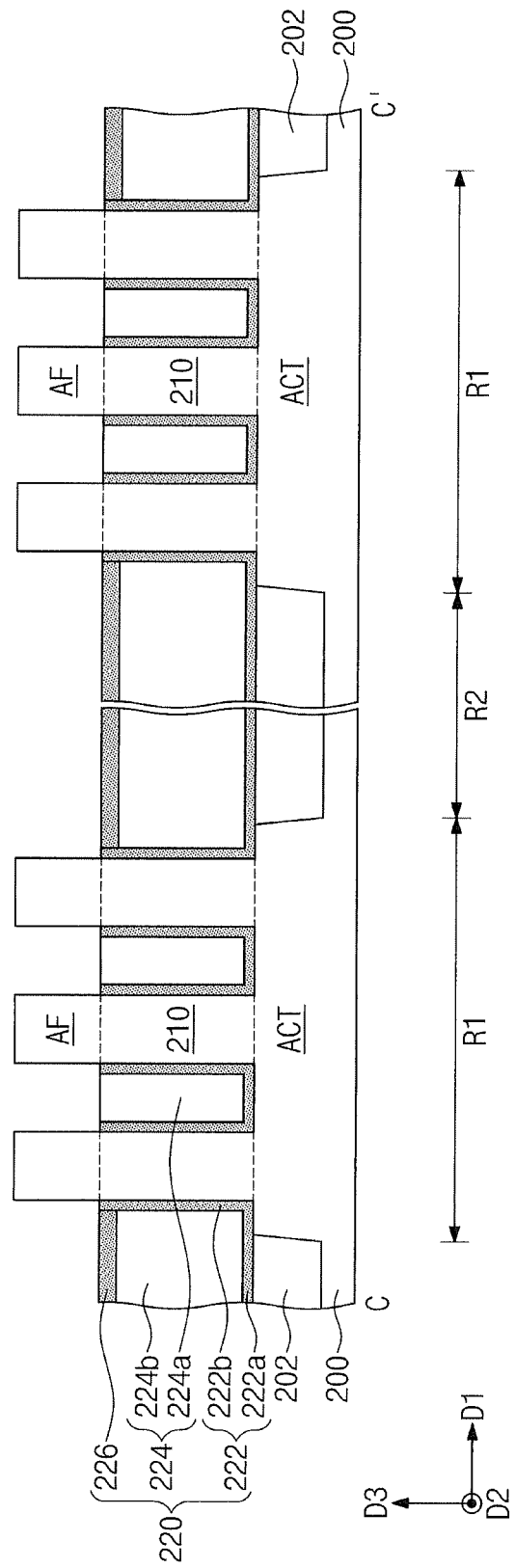
Figure 23B:
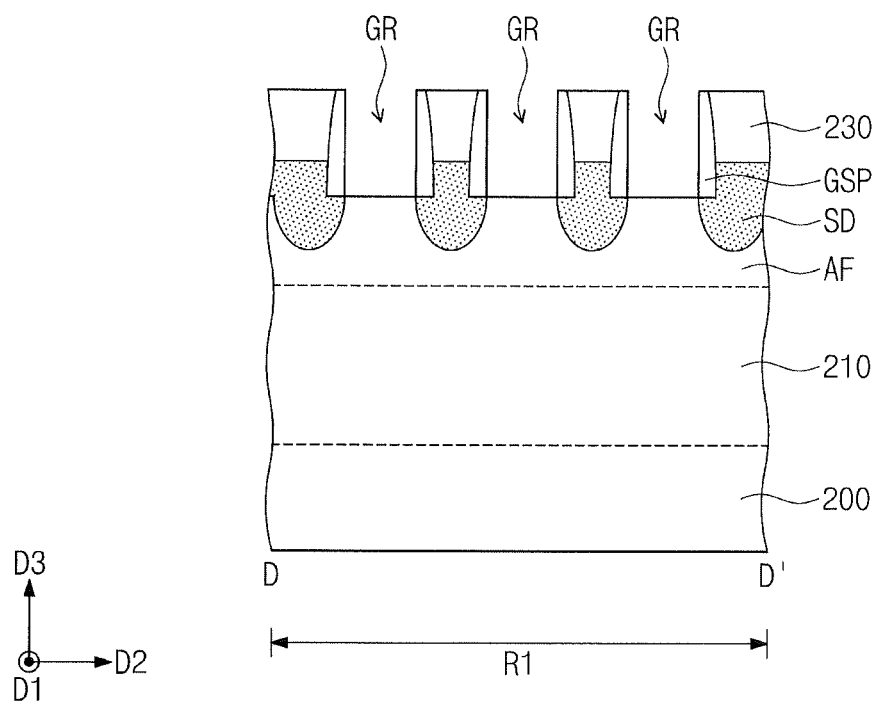

Referring to FIGS. 16, 23A, and 23B, an interlayer dielectric layer 230 may be formed to fill between the sacrificial patterns SFP. The formation of the interlayer dielectric layer 230 may include forming an insulation layer (not shown) to cover the sacrificial patterns SFP and performing a planarization process on the insulation layer until top surfaces of the sacrificial patterns SFP are exposed. The planarization process may remove the sacrificial mask patterns SMP.

The sacrificial patterns SFP and the etch stop patterns ESP may be sequentially and selectively removed. Gap regions GR may be defined to refer to zones where the sacrificial patterns SFP and the etch stop patterns ESP are removed. The gap regions GR may partially expose the active fins AF and the lower insulation structure 220.

Figure 24A:
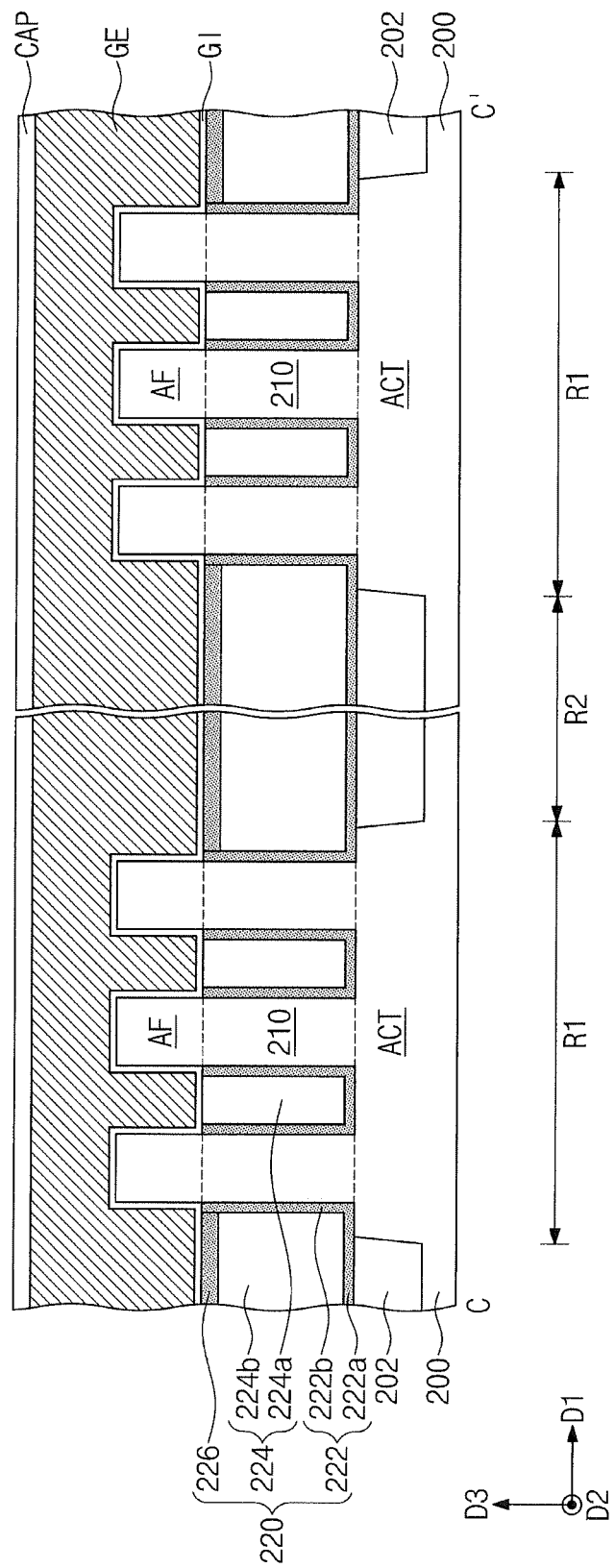
Figure 24B:
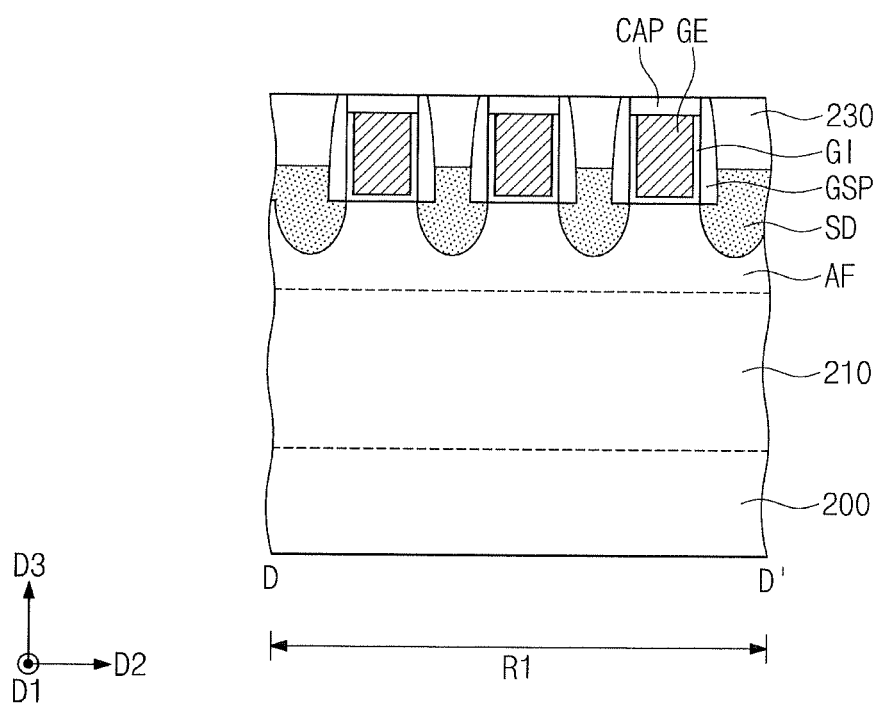

Referring to FIGS. 16, 24A, and 24B, a gate dielectric pattern GI, a gate electrode GE, and a capping pattern CAP may be formed in each of the gap regions GR. The formation of the gate dielectric pattern GI and the gate electrode GE may include forming a gate dielectric layer (not shown) to conformally cover the gap regions GR, forming a gate conductive layer (not shown) to fill the gap regions GR, and performing a planarization process until a top surface of the interlayer dielectric layer 230 is exposed. Thereafter, the gate electrode GE may be partially recessed, and then the capping pattern CAP may be formed on the gate electrode GE.

Referring back to FIGS. 16, 17A, and 17B, upper contacts 240 may be formed in the interlayer dielectric layer 230. Each of the upper contacts 240 may penetrate the interlayer dielectric layer 230 to come into connection with the source/drains SD.

According to exemplary embodiments of the present inventive concepts, a semiconductor device may include a gate electrode or an active fin having a uniform vertical length. It therefore may be possible to reduce distribution in electrical characteristics of the semiconductor device according to exemplary embodiments of the present inventive concepts.

Although the present invention has been described in connection with the embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor device, comprising:
    a substrate including spaced apart first regions and a second region between the first regions;
    active patterns protruding from the substrate;
    an insulation structure surrounding lower portions of the active patterns, each of the lower portions of the active patterns having a first sidewall and a second sidewall facing each other; and
    a gate electrode and a gate dielectric pattern on the insulation structure, the gate dielectric pattern surrounding sidewalls and a bottom surface of the gate electrode,
    wherein the insulation structure comprises:
        a first line pattern covering a top surface of the substrate and to the first sidewall and the second sidewall of the each of the lower portions of the active patterns;
        a second line pattern disposed below the gate electrode in the second region; and
        a buried pattern disposed between the first line pattern and the second line pattern,
    wherein a bottom surface of the gate dielectric pattern contacts at least one of a top surface of the buried pattern and a top surface of the second line pattern.

2. The semiconductor device of claim 1, wherein the first line pattern comprises a horizontal portion on the top surface of the substrate and vertical portions extending from the horizontal portion onto the sidewalls of the active patterns, and wherein the buried pattern is positioned on a top surface of the horizontal portion and on sidewalls of the vertical portions.

3. The semiconductor device of claim 1, wherein the buried pattern comprises a first buried portion disposed between the active patterns; and
    a second buried portion outside of the active patterns.

4. The semiconductor device of claim 3, wherein the first and second buried portions of the buried pattern have top surfaces at substantially the same level.

5. The semiconductor device of claim 3, wherein the first buried portion has a top surface with a level higher than a top surface of the second buried portion.

6. The semiconductor device of claim 5, wherein the second line pattern is provided on the second buried portion.

7. The semiconductor device of claim 6, wherein the second line pattern is not provided on the first buried portion.

8. The semiconductor device of claim 6, wherein the second line pattern has a top surface with a level substantially the same as the top surface of the first buried portion.

9. The semiconductor device of claim 1, further comprising a device isolation layer in the substrate and defining an active region, wherein the active patterns are positioned on the active region and wherein the insulation structure covers the device isolation layer.

10. The semiconductor device of claim 1, wherein each of the active patterns comprises:
    a first source/drain at a lower portion of the each of the active patterns;
    a second source/drain at an upper portion of the each of the active patterns; and
    a channel between the first source/drain and the second source/drain.

11. The semiconductor device of claim 1, wherein the active patterns are spaced apart along a first direction, and wherein the gate electrode surrounds the active patterns and has a longitudinal axis extending along the first direction.

12. A semiconductor device, comprising:
    a substrate including spaced apart first regions and a second region between the first regions;
    first active patterns protruding from the substrate on a first one of the first regions;
    second active patterns protruding from the substrate on a second one of the first regions;
    a gate electrode and a gate dielectric pattern on the substrate, the gate dielectric pattern surrounding sidewalls and a bottom surface of the gate electrode; and
    an insulation structure surrounding lower portions of the first and second active patterns, each of the first and the second active patterns having a first sidewall and a second sidewall facing each other;
    wherein the insulation structure comprises:
        a first line pattern conforming to a top surface of the substrate, the first sidewall and the second sidewall of the each of the first and second active patterns;
        a second line pattern disposed below the gate electrode in the second region; and
        a buried pattern disposed between the first line pattern and the second line pattern wherein a bottom surface of the gate dielectric pattern contacts at least one of a top surface of the buried pattern and a top surface of the second line pattern.

13. The semiconductor device of claim 12, wherein the first line pattern comprises a horizontal portion on the top surface of the substrate and vertical portions extending from the horizontal portion onto the sidewalls of the first and second active patterns, and wherein the buried pattern is positioned on a top surface of the horizontal portion and on sidewalls of the vertical portions.

14. The semiconductor device of claim 12, wherein the buried pattern comprises first buried portions on respective ones of the first regions and a second buried portion on the second region.

15. The semiconductor device of claim 14, wherein the first buried portions have top surfaces at substantially the same level as a top surface of the second buried portion.

16. The semiconductor device of claim 14, wherein the first buried portions have top surfaces at a level higher than a top surface of the second buried portion.

17. The semiconductor device of claim 16, wherein the second line pattern is provided on the second buried portion, wherein the second line pattern has a top surface at substantially the same level as the top surfaces of the first buried portions.

18. A semiconductor device, comprising:
an active pattern protruding from a substrate;
an insulation structure surrounding a lower portion of the active pattern, the lower portion of the active pattern having sidewalls facing each other; and
a gate electrode and a gate dielectric pattern on the insulation structure, the gate dielectric pattern surrounding sidewalls and a bottom surface of the gate electrode,
wherein the insulation structure comprises:
a first line pattern including a horizontal portion on a top surface of the substrate and a vertical portion extending from the horizontal portion onto the sidewalls of the active pattern;
a second line pattern disposed below the gate electrode; and
a buried pattern disposed on the first line pattern,
wherein a bottom surface of the gate dielectric pattern contacts a top surface of the buried pattern.

19. The semiconductor device of claim 18, wherein the second line pattern is provided on one side of the active pattern, wherein the second line pattern is connected to the vertical portion.

* * * * *